US012476164B2

United States Patent
Yu et al.

(10) Patent No.: US 12,476,164 B2
(45) Date of Patent: Nov. 18, 2025

(54) SEMICONDUCTOR PACKAGE AND METHOD

(71) Applicant: Taiwan Semiconductor Manufacturing Co., Ltd., Hsinchu (TW)

(72) Inventors: Chen Chiang Yu, Taoyuan (TW); Tsung-Fu Tsai, Changhua (TW); Szu-Wei Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 615 days.

(21) Appl. No.: 17/806,532

(22) Filed: Jun. 13, 2022

(65) Prior Publication Data

US 2023/0402345 A1    Dec. 14, 2023

(51) Int. Cl.
*H01L 23/367*    (2006.01)
*H01L 21/48*    (2006.01)

(52) U.S. Cl.
CPC ...... *H01L 23/3677* (2013.01); *H01L 21/4882* (2013.01)

(58) Field of Classification Search
CPC ............ H01L 23/3677; H01L 21/4882; H01L 21/486; H01L 23/49811; H01L 23/5384; H01L 23/473
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2017/0133351 A1* | 5/2017 | Su .................. | H01L 23/5389 |
| 2020/0161216 A1 | 5/2020 | Canaperi et al. | |
| 2020/0176357 A1* | 6/2020 | Yu .................. | H01L 23/10 |

FOREIGN PATENT DOCUMENTS

TW    202038398 A    10/2020

* cited by examiner

*Primary Examiner* — Patricia D Valenzuela
(74) *Attorney, Agent, or Firm* — Slater Matsil, LLP

(57) ABSTRACT

A semiconductor package including a cooling system and a method of forming are provided. The semiconductor package may include an interposer, one or more package components bonded to the interposer, an encapsulant on the interposer, and a cooling system over the one or more package components. The cooling system may include one or more metal layers on top surfaces of the one or more package components, first metal pins on the one or more metal layers, second metal pins, wherein each of the second metal pins may be bonded to a corresponding one of the first metal pins by solder, and a first lid over the second metal pins, wherein the first lid may include openings.

20 Claims, 23 Drawing Sheets

SEMICONDUCTOR PACKAGE AND METHOD

BACKGROUND

The formation of integrated circuits includes forming integrated circuit devices on semiconductor wafers, and then sawing the semiconductor wafers into device dies. The device dies may be bonded to package components such as interposers, package substrates, printed circuit boards, or the like. To protect the device dies and the bonding structures that bond a device die to a package component, an encapsulant such as a molding compound, an underfill, or the like, may be used to encapsulate the device dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
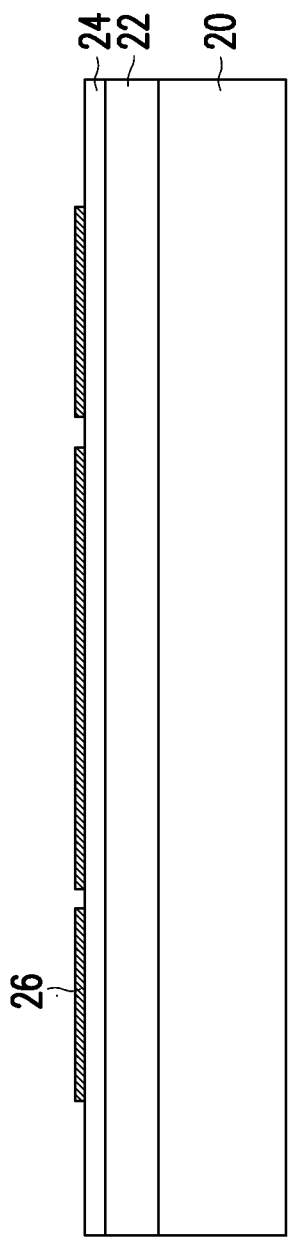
FIGS. 1-10, 11A, 11B, 11C, 12, 13A, 13B, 13C, 14-18, 19A, 19B, and 19C illustrate the cross-sectional views and top views of intermediate stages in the formation of a package including a pin cooling system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package with a pin cooling system and the method of forming the same are provided. In accordance with some embodiments, one or more device dies are bonded to an underlying package component, such as an interposer. The one or more device dies are molded in an encapsulant, such as a molding compound. Top surfaces of the one or more device dies are bonded to a pin cooling system by one or more metal layers. The pin cooling system comprises two parts bonded by thermally conductive material, which allows for the system to account for warpage that may occur during processing and/or use. The inner surfaces of the pin cooling system are coated with a protective layer to prevent or reduce corrosion. The pin cooling system dissipates the heat generated by the one or more device dies, which leads to higher efficiency and better long-term reliability of the semiconductor package.

Embodiments discussed herein provide examples to enable making and using the subject matter of this disclosure, and it is understood that modifications can be made while remaining within contemplated scopes of different embodiments. Throughout the various views and illustrative embodiments, like reference numbers are used to designate like features. Although method embodiments may be discussed as being performed in a particular order, other method embodiments may be performed in any logical order.

FIGS. 1-10, 11A, 11B, 11C, 12, 13A, 13B, 13C, 14-18, 19A, 19B, and 19C illustrate the cross-sectional views and top views of intermediate stages in the formation of a package including a pin cooling system in accordance with some embodiments. The corresponding processes are also reflected schematically in the process flow shown in FIG. 20.

Figure 4:
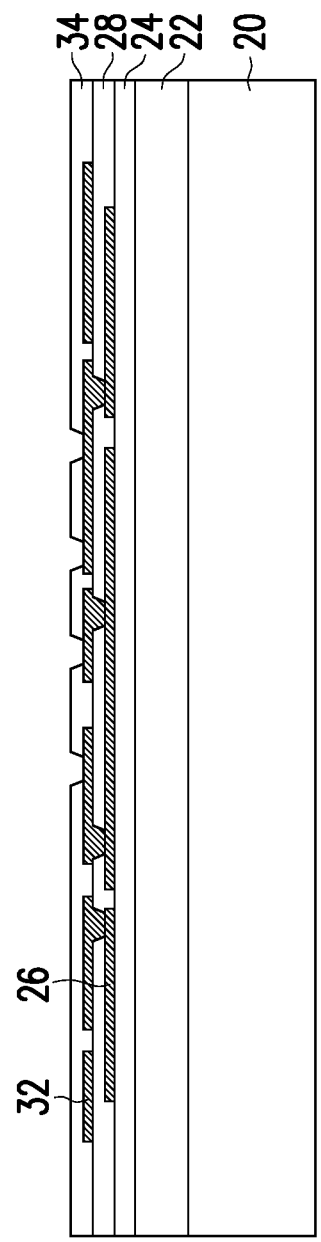
Figure 5:
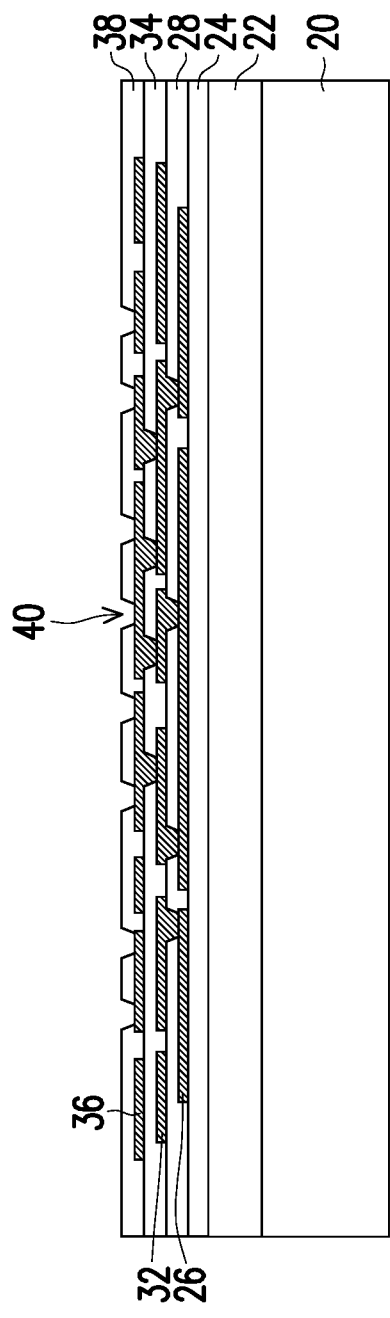
Figure 6:
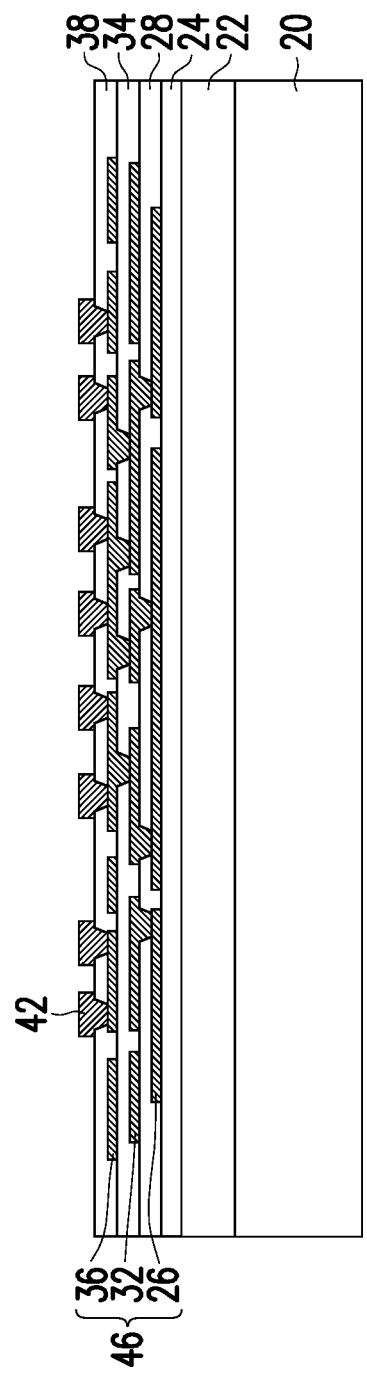
Figure 20:
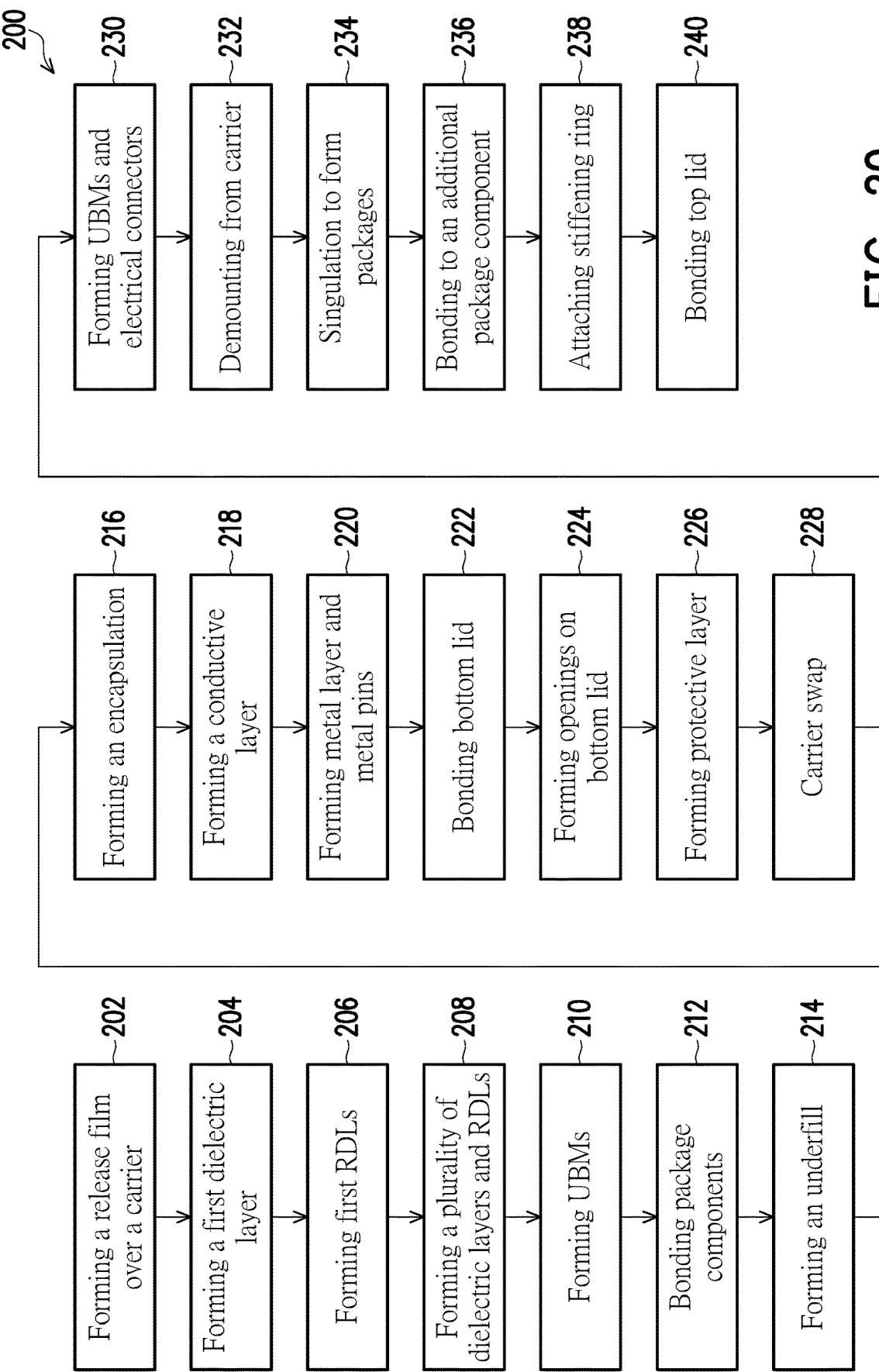
FIG. 20 illustrates a process flow for forming a package in accordance with some embodiments.

FIGS. 1 through 6 illustrate the cross-sectional views of the formation of an interposer 46 (e.g., a build-up interposer) as shown in FIG. 6. Referring first to FIG. 1, a release film 22 is formed on a carrier 20. The respective process is illustrated as process 202 in the process flow 200 as shown in FIG. 20. The carrier 20 may be a glass carrier, an organic carrier, or the like. The carrier 20 may have a round top-view shape, and may have a size of a silicon wafer. The release film 22 may be formed of a polymer-based material, such as a light-to-heat-conversion (LTHC) material, which may be removed along with the carrier 20 from the overlying structures that will be formed in subsequent steps. In some embodiments, the release film 22 comprises an epoxy-based thermal-release material. The release film 22 may be coated onto carrier 20.

An insulating layer 24 is formed on the release film 22. The respective process is illustrated as process 204 in the process flow 200 as shown in FIG. 20. In some embodiments, the insulating layer 24 comprises an organic material (e.g., polybenzoxazole (PBO), polyimide, benzocyclobutene (BCB), or the like) or an inorganic dielectric material (e.g., silicon oxide, silicon nitride, silicon carbide, silicon oxynitride, silicon oxycarbide, silicon oxycarbonitride, Un-doped Silicate Glass (USG), or the like).

Redistribution lines (RDLs) 26 are formed over the insulating layer 24. The respective process is illustrated as process 206 in the process flow 200 as shown in FIG. 20. The formation of the RDLs 26 may include forming a seed layer (not shown) over the insulating layer 24, forming a patterned mask (not shown) such as a photoresist or one or more layers of dielectric material over the seed layer, and plating a conductive material on the exposed seed layer. The patterned mask and the portions of the seed layer covered by the patterned mask are removed. In embodiments in which the photoresist is used as the patterned mask, the patterned mask is removed by an acceptable ashing or stripping process, such as using an oxygen plasma or the like. In embodiments in which the one or more layers of dielectric material are used as the patterned mask, the patterned mask is removed by an acceptable stripping process, such as wet or dry etching. The remaining conductive material and the underlying seed layer may be collectively referred to as the RDLs 26 as shown in FIG. 1. The seed layer and the plated conductive material may be formed of the same material or different materials. The seed layer may be a single metal layer or a composite layer comprising a plurality of sublayers formed of different metallic materials. In some embodiments, the seed layer may comprise a titanium layer and a copper layer over the titanium layer. The conductive material may be a metal or a metal alloy including aluminum, nickel, copper, titanium, tungsten, and/or alloys thereof. The seed layer may be formed using Physical Vapor Deposition (PVD) or the like. The plating process may be performed using Electro Chemical Plating (ECP), electroless plating, or the like.

Figure 2:
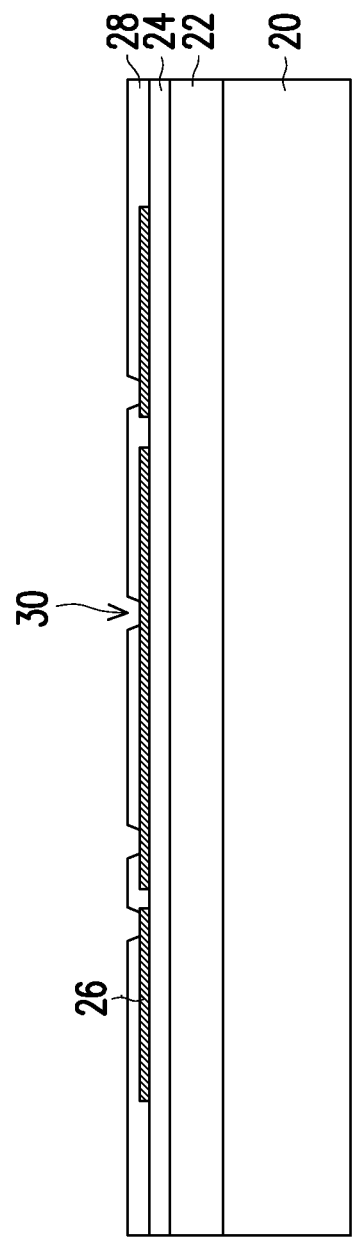

FIGS. 2 through 5 illustrate the formation of one or more additional insulating layers and RDLs. The respective process is illustrated as process 208 in the process flow 200 as shown in FIG. 20. Referring to FIG. 2, an insulating layer 28 is formed and patterned on the RDLs 26. The bottom surface of the insulating layer 28 is in contact with the top surfaces of the RDLs 26 and the insulating layer 24. The insulating layer 28 may comprise an organic or inorganic material, which may be selected from the same group of candidate materials for forming the insulating layer 24. The insulating layer 28 is patterned to form openings 30 in the insulating layer 28 to expose portions of the RDLs 26.

Figure 3:
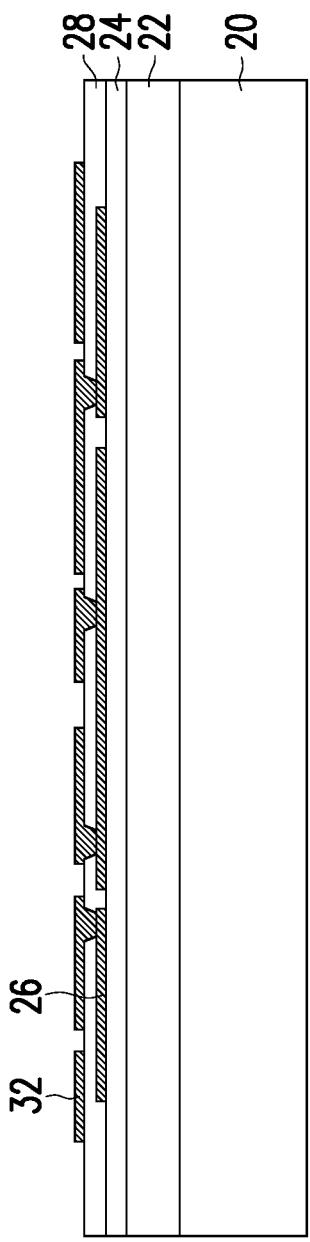

In FIG. 3, RDLs 32 are formed to connect to the RDLs 26. The RDLs 32 may include metal lines over the insulating layer 28. The RDLs 32 may also include metal vias extending into the openings 30 in the insulating layer 28 to connect to a conductive line of the RDLs 26. The RDLs 32 may be formed using the same or similar materials and processes as discussed above with reference to the RDLs 26. In FIG. 4, insulating layer 34 is formed and patterned on the RDLs 32 and the insulating layer 28. The insulating layer 34 may be formed and patterned using the same or similar materials and processes as discussed above with reference to the insulating layer 24.

FIG. 5 illustrates the formation of RDLs 36, which are electrically connected to respective conductive features of the RDLs 32. The formation of RDLs 36 may be formed using the same or similar materials and processes as discussed above with reference to the RDLs 26. Insulating layer 38 is formed on the RDLs 36 and patterned to form openings 40, and some portions of the RDLs 36 are exposed through the openings in the insulating layer 38. The insulating layer 38 may be formed and patterned using the same or similar materials and processes as discussed above with reference to the insulating layer 24. It is appreciated that three layers of the RDLs (26, 32, and 36) are illustrated in FIG. 5 as an example, the structure may have any number of the RDL layers.

FIG. 6 illustrates the formation of conductive pads, such as Under-Bump Metallurgies (UBMs) 42. The respective process is illustrated as process 210 in the process flow 200 as shown in FIG. 20. The locations of the openings 40 (shown in FIG. 5) in the insulating layer 38 may correspond to the locations in which UBMs 42 are to be formed. The UBMs 42 be formed using the same or similar materials and processes as discussed above with reference to the RDLs 26. The insulating layers 24, 28, 34, and 38 and the RDLs 26, 32, and 36 may be referred to as an interposer 46. In some embodiments the conductive pads may comprise conductive pillars.

FIGS. 1-6 illustrated an example in which the interposer 46 is a build-up interposer formed on a carrier substrate. Other interposers may be used. In some embodiments, the interposer 46 is a semiconductor interposer, which may include a semiconductor substrate, such as silicon substrate, through-silicon vias and redistribution lines formed on the semiconductor substrate.

Figure 7:
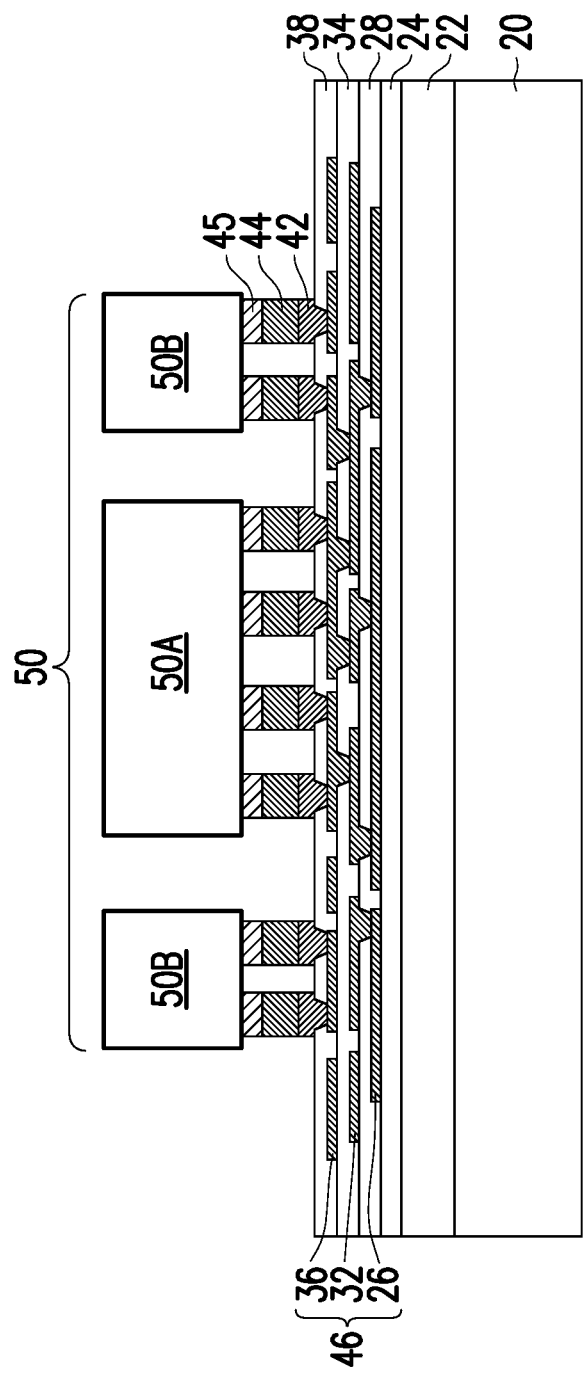

In FIG. 7, package components 50A and 50B (collectively or individually referred to as package components 50) are bonded to the interposer 46. The respective process is illustrated as process 212 in the process flow 200 as shown in FIG. 20. Each of package components 50 may be one or more device dies, a package with one or more device dies packaged therein, a System-on-Chip (SoC) die including a plurality of device dies packaged as a system, or the like. The device dies in package components 50 may be or may comprise logic dies, memory dies, input-output dies, Integrated Passive Devices (IPDs), or the like, or combinations thereof. For example, the logic device dies in package components 50 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 50 may include Static Random Access Memory (SRAM) dies, Dynamic Random Access Memory (DRAM) dies, or the like. The package components 50 may include external connectors 45.

In some embodiments, the package components 50 are bonded to the interposer 46 using electrical connectors 44. In some embodiments, the electrical connectors 44 may be solder balls. In some embodiments, the electrical connectors 44 may be non-solder metal pillars, or metal pillars and solder caps over the non-solder metal pillars, which may be formed through a plating process. Other types of bonding, such as metal-to-metal direct bonding, hybrid bonding (including both of dielectric-to-dielectric fusion bonding and metal-to-metal direct bonding), or the like may also be used. FIG. 7 shows a portion of the interposer 46 and the carrier 20 with three package components 50 attached to the interposer 46 for illustrative purposes. The interposer 46 may extend over a larger portion of the carrier 20, other package components may be bonded to the interposer 46 in other portions of the carrier 20.

Figure 8:
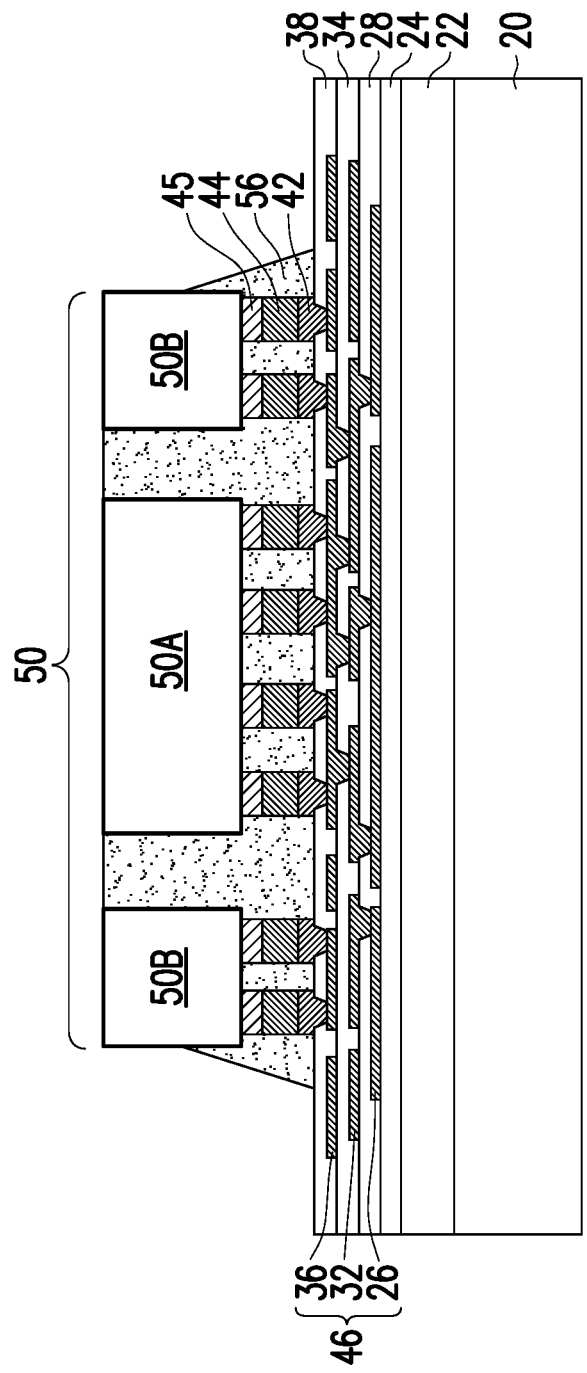

In FIG. 8, an underfill 56 is formed between package components 50 and interposer 46 to reduce stress and protect the joints between the package components 50 and interposer 46, such as electrical connectors 44. The respective process is illustrated as process 214 in the process flow 200 as shown in FIG. 20. The underfill 56 may include a base material, such as an epoxy, and filler particles in the epoxy. The underfill 56 may be deposited by a capillary flow process after the package components 50 are bonded to the interposer 46 or may be formed by a suitable deposition method before the package components 50 are bonded to the interposer 46. For example, the underfill 56 may be dispensed from one side of the package components 50, and flow into the gaps between the package components 50 and the interposer 46 as well as the gaps between the neighboring package components 50 through capillary action. Underfill 56 may be subsequently cured. FIG. 8 shows the underfill 56 has a flat top surface level with top surfaces of the package components 50 as an example. In some embodiments, the top surface of the underfill 56 may not be flat and may be lower than the top surfaces of the package components 50.

Figure 9:
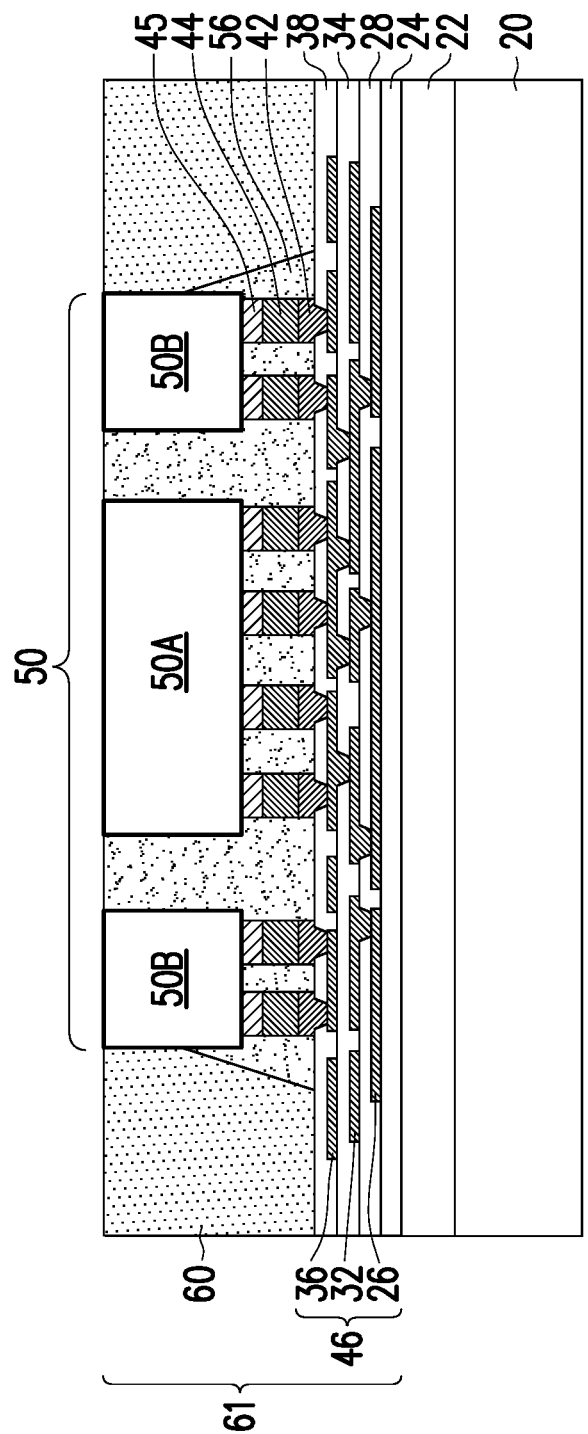

In FIG. 9, the package components 50 are encapsulated in encapsulant 60. The respective process is illustrated as process 216 in the process flow 200 as shown in FIG. 20. The encapsulant 60 covers the package components 50 and may fill the gaps, if any, between the neighboring package components 50. The encapsulant 60 may comprise a molding compound, a molding underfill, an epoxy, a resin, or the like. In some embodiments, the encapsulant 60 may include a base material, which may be a polymer, a resin, an epoxy, or the like, and filler particles in the base material. The filler particles may include dielectric particles of silicon oxide, aluminum oxide, silica, or the like, and may have spherical shapes. Also, the spherical filler particles may have the same or different diameters. The encapsulant 60 may be applied by compression molding, transfer molding, or the like. The encapsulant 60 may be applied in liquid or semi-liquid form and subsequently cured.

A planarization process may be performed on the encapsulant 60 to expose top surfaces of the package components 50. Top surfaces of the package components 50 and the encapsulant 60 are substantially coplanar after the planarization process within process variations. The planarization process may be a chemical-mechanical polish (CMP), a grinding process, or the like. In some embodiments, the planarization may be omitted. In some embodiments, the encapsulant 60 may remain over one or more or all of the package components 50. The package components 50, the interposer 46, the underfill 56, and/or the encapsulant 60 may be collectively referred to as a wafer structure 61.

Figure 17:
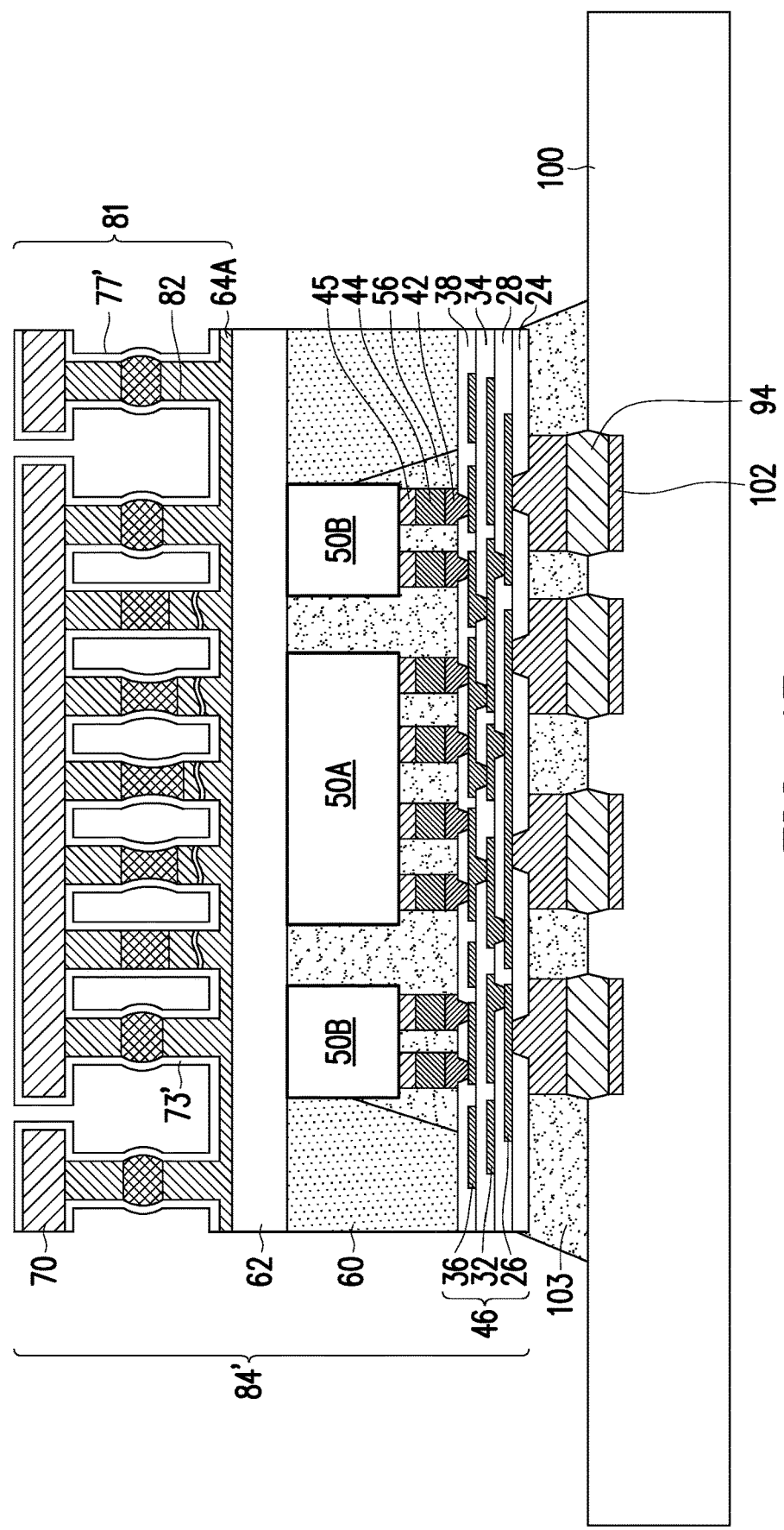
Figure 18:
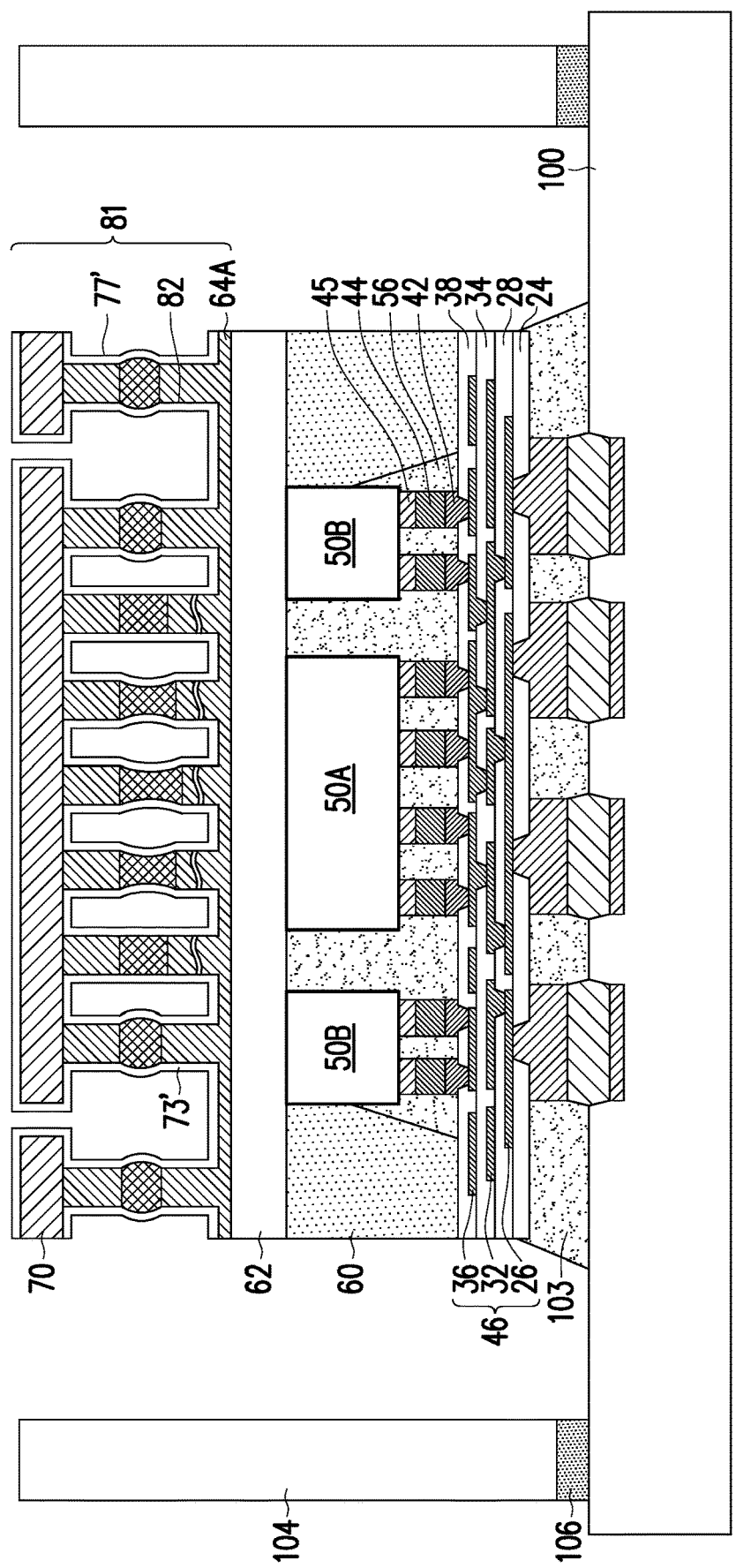
Figure 19A:
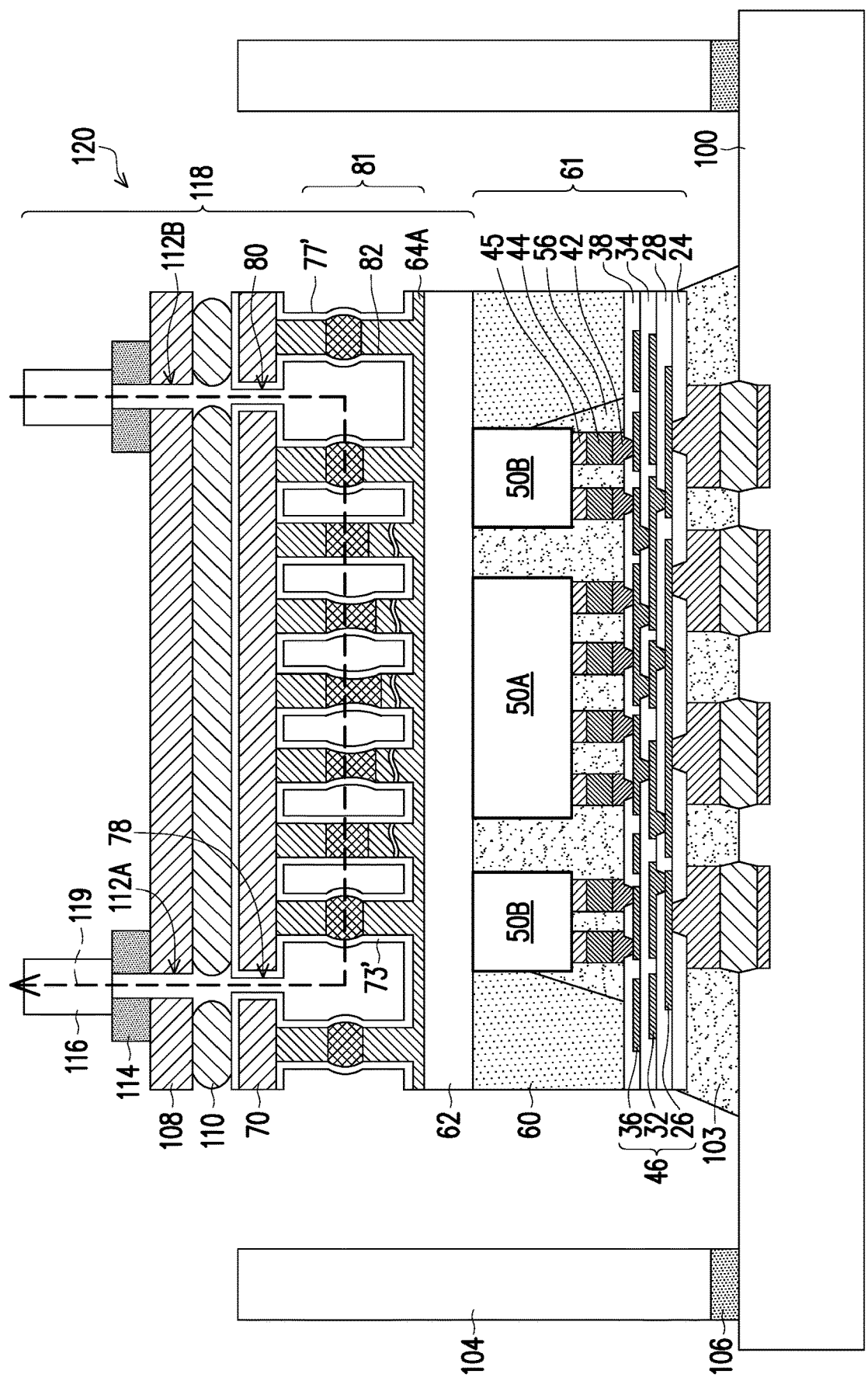

FIGS. 10 through 19C illustrate the cross-sectional and top views of various intermediate steps in the formation of a pin cooling system 118 as shown in FIG. 19A. The pin cooling system 118 dissipates the heat generated by the package components 50, which leads to higher efficiency and better long-term reliability of the semiconductor package 120 (shown FIG. 19A).

Figure 10:
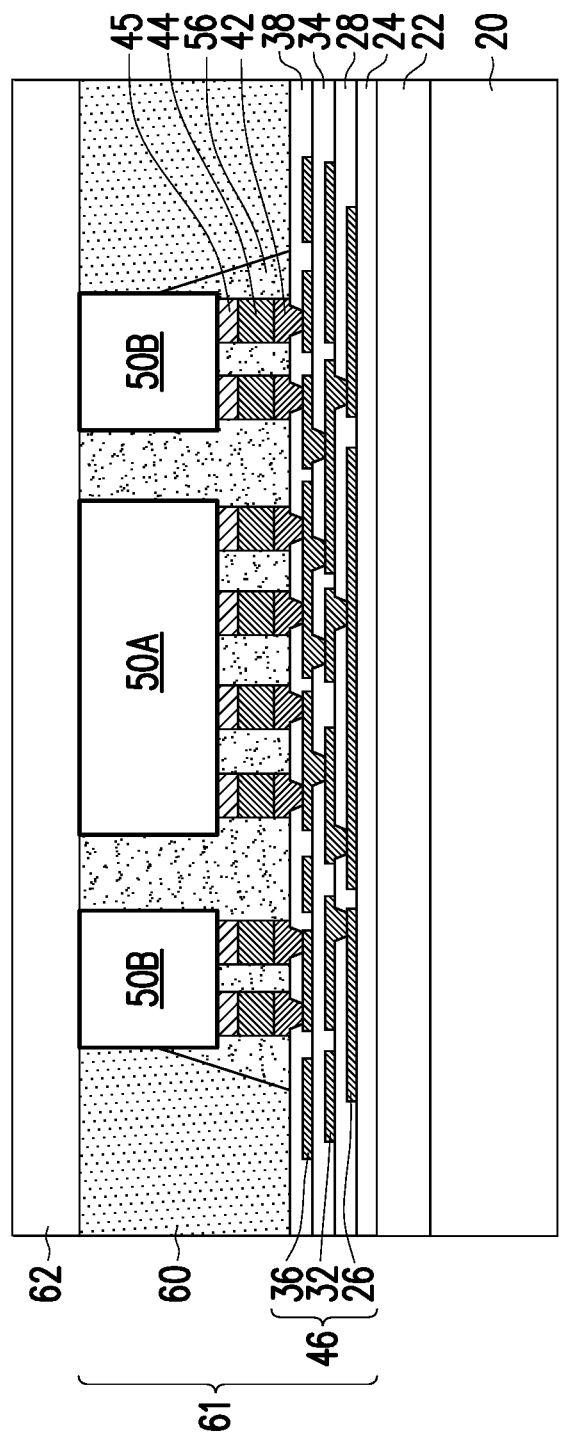

In FIG. 10, a thermally conductive layer 62 is formed on the top surfaces of the encapsulant 60 and the package components 50. The respective process is illustrated as process 218 in the process flow 200 as shown in FIG. 20. The thermally conductive layer 62 may comprise one or more layers of thermally conductive material. In some embodiments, the thermally conductive layer 62 comprises a composite layer comprising a plurality of sub-layers (not shown) formed of different metals, such as aluminum, titanium, nickel, vanadium, gold, or the like. The thermally conductive layer 62 may have a thickness in a range from about 0.3 µm to about 5 µm, wherein each sub-layer may have a thickness in a range from about 0.05 µm to about 1 µm. Each sub-layer may be formed using a corresponding deposition process, such as PVD or the like.

In some embodiments, the thermally conductive layer 62 comprises five sub-layers. A first sub-layer comprising aluminum formed on the top surfaces of the encapsulant 60 and the package components 50 using a first deposition process. A second sub-layer of titanium is formed on the first sub-layer, a third sub-layer of nickel is formed on the second sub-layer, a fourth sub-layer of vanadium is formed on the third sub-layer, and a fifth sub-layer of gold is formed on the fourth sub-layer. Other configurations may be used.

Figure 11A:
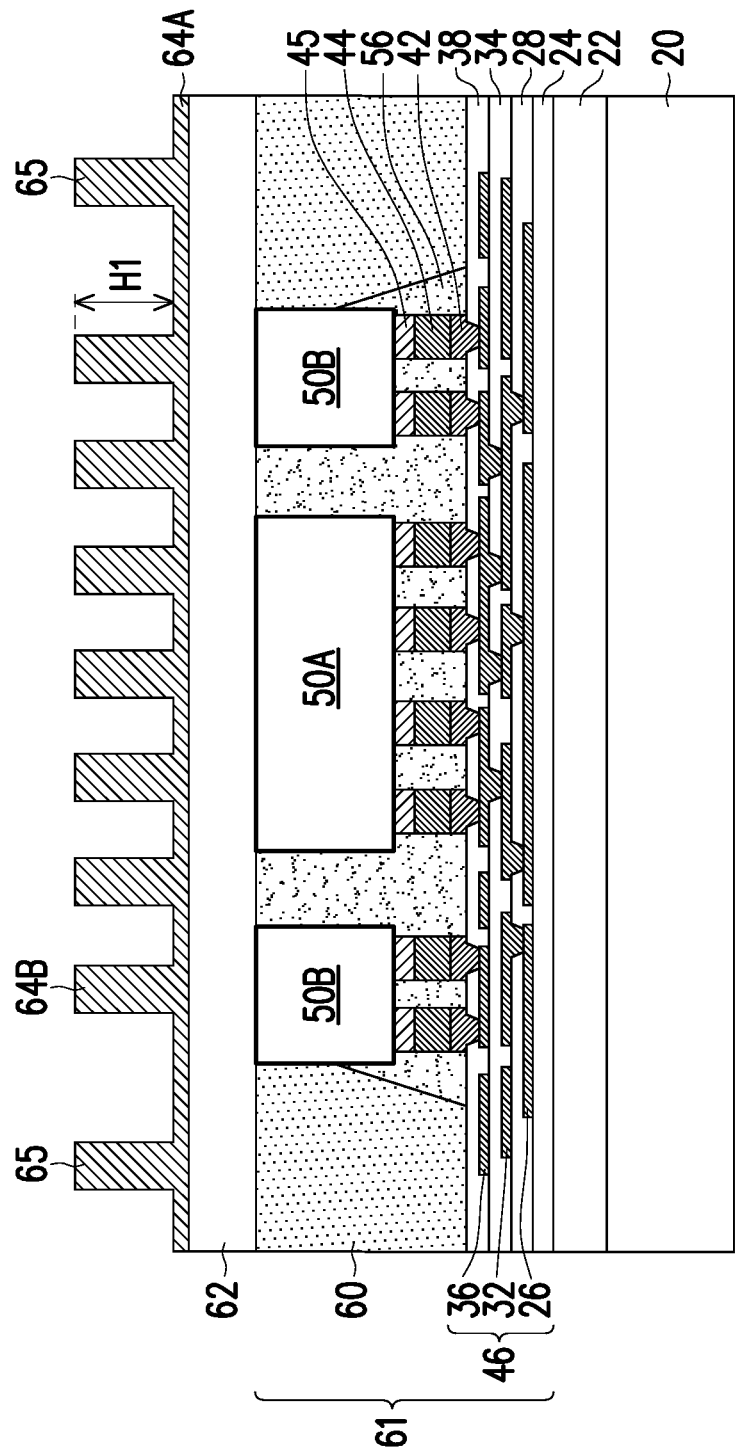
Figure 11B:
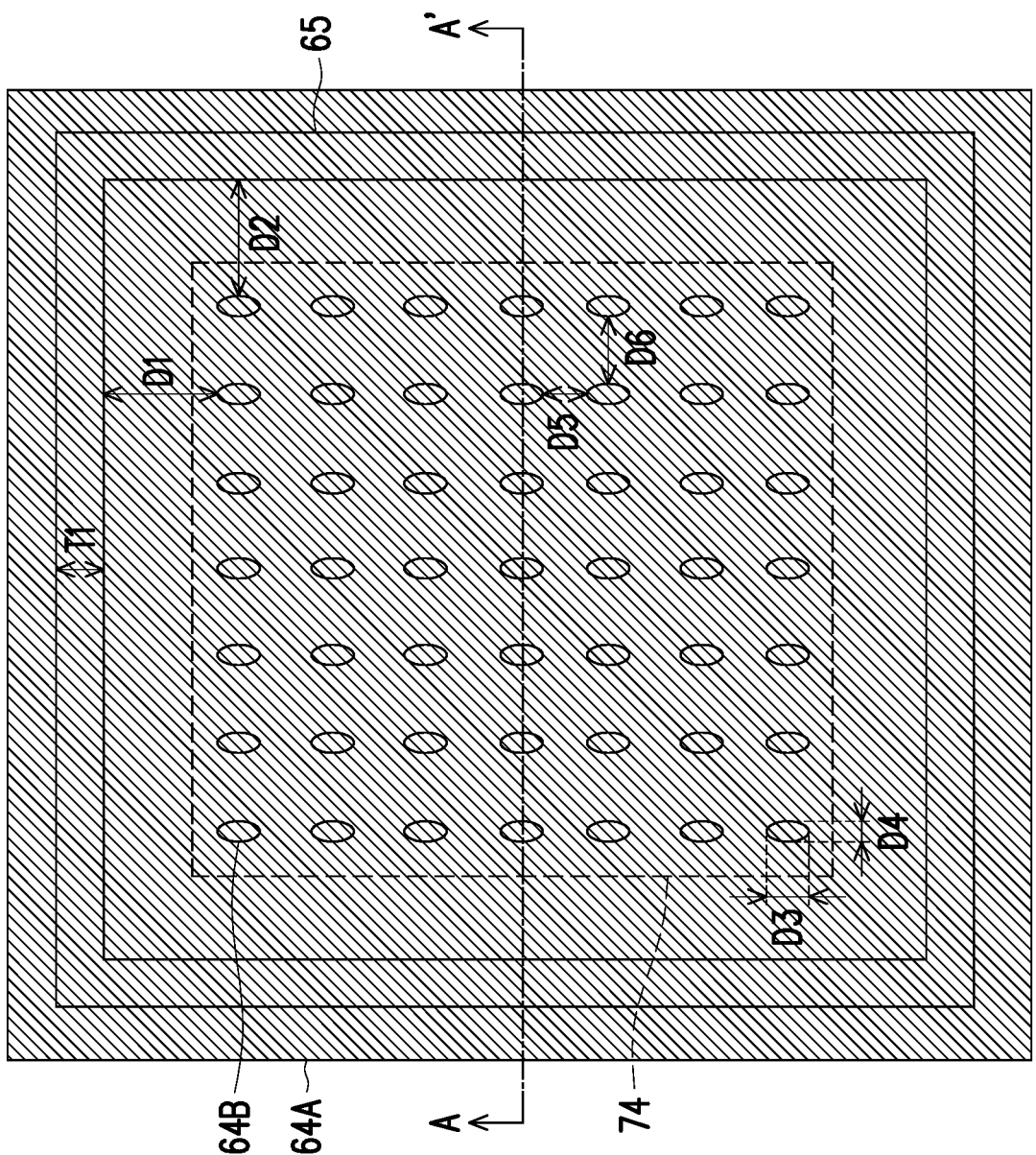
Figure 11C:
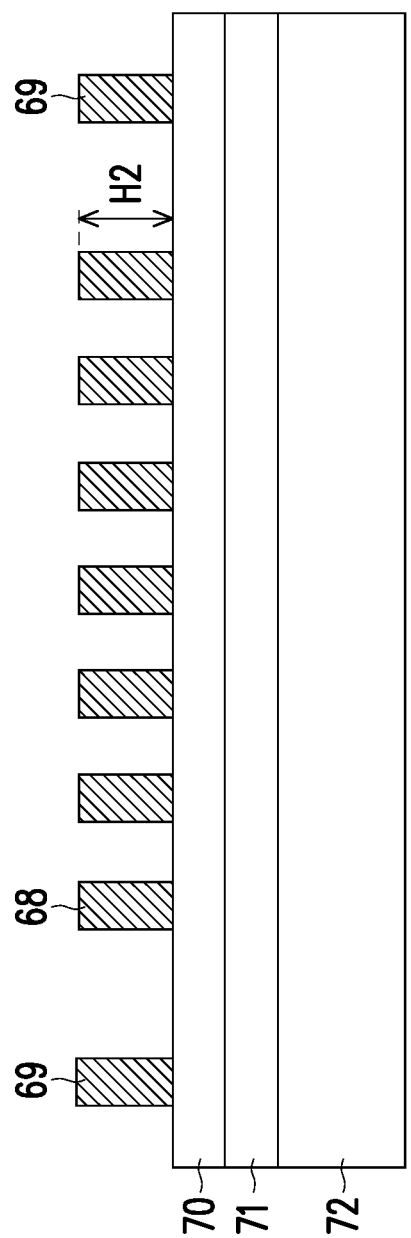

FIGS. 11A-11C illustrate cross-sectional and top views of the formation of parts of the pin cooling system 118 (shown in FIG. 19A). As discussed in greater detail below, the pin cooling system 118 includes a cooling chamber 81 (shown in FIG. 13B), which is formed of a lower part and an upper part. The lower part of the cooling chamber 81 is illustrated in FIGS. 11A and 11B, and is formed over the structure illustrated in FIG. 10. The lower part of the pin cooling system includes a heat transfer layer 64A, heat transfer pins 64B, and cavity walls 65. The cross-sectional view shown in FIG. 11A may be obtained from the reference cross-section A-A' in the top view shown in FIG. 11B, wherein like reference numerals refer to like features. The upper part of the cooling chamber 81, which comprises the heat transfer pins 68, the cavity wall 69, and a bottom lid 70, is illustrated in FIG. 11C and is subsequently bonded to the lower part using thermal connectors 66, such as solder. The utilization of the thermal connectors 66 allows each heat transfer pin 64B to be connected to the corresponding heat transfer pin 68 and a seal to be formed between cavity wall 65 and cavity wall 69, despite the warpage that may occur in the carrier 20, thereby improving the cooling capacity of the pin cooling system 118 as well as preventing or reducing coolant leakage in the cooling chamber 81.

Referring now to FIG. 11A, the heat transfer layer 64A is formed on the thermally conductive layer 62, and an array of the heat transfer pins 64B and the cavity wall 65 are formed on the heat transfer layer 64A. The respective process is illustrated as process 220 in the process flow 200 as shown in FIG. 20. The heat transfer layer 64A may be formed using a blanket deposition process, such as PVD or the like. The heat transfer layer 64A may comprise a material having high thermal conductivity, such as copper or other metals. The heat transfer layer 64A may have a thickness in a range from about 0.05 µm to about 1 µm.

The formation of the heat transfer pins 64B and the cavity wall 65 on the heat transfer layer 64A may including forming a patterned mask (not shown), such as a photoresist or one or more layers of dielectric material over the heat transfer layer 64A, and plating a thermally conductive material on the exposed portions of the heat transfer layer 64A. The patterned mask may be removed after the plating. In embodiments in which the photoresist is used as the patterned mask, the patterned mask may be removed by an acceptable ashing or stripping process, such as using an oxygen plasma or the like. In embodiments in which the one or more layers of dielectric material are used as the patterned mask, the patterned mask is removed by an acceptable stripping process, such as wet or dry etching. The thermally conductive material of the heat transfer pins 64B may comprise the same material as the material in the heat transfer layer 64A. The plating process may be performed using ECP, electro-less plating, or the like. The heat transfer pins 64B and the cavity wall 65 may have substantially the same height H1 within process variations, which may be in a range from about 0.1 mm to about 1 m.

In FIG. 11B, a top view of the heat transfer layer 64A, an array of heat transfer pins 64B, and the cavity wall 65 on the heat transfer layer 64A are shown. The cavity wall 65 may encircle the array of heat transfer pins 64B in a heat transfer pin region 74. Horizontal segments of the cavity wall 65 may be spaced apart from the closest row of the heat transfer pins 64B by a distance D1, which may be in a range from about 0.1 mm to about 3 mm. Vertical segments of the cavity wall 65 may be spaced apart from the closest column of the heat transfer pins 64B by a distance D2, which may be in a range from about 0.1 mm to about 3 mm. The cavity wall 65 may have a thickness T1, which may be in a range from about 0.1 mm to about 5 mm. In some embodiments, the heat transfer pins 64B may have substantially uniform shapes and sizes within process variations in the top view. In some embodiments, the top surfaces of the heat transfer pins 64B may be elliptical, which may have a length D3 in a range from about 10 µm to about 5.5 mm and a width D4 in a range from about 5 µm to about 1 mm. In some embodiments, the top surfaces of the heat transfer pins 64B may be circular (not shown), which may have a diameter in a range from about 10 µm to about 1000 µm. Other shapes and sizes are possible.

Within the array of the heat transfer pins 64B, each row of the heat transfer pins 64B may be spaced apart from a neighboring row of the heat transfer pins 64B by a distance D5, which may be in a range from about 1 mm to about 10 mm, and each column of the heat transfer pins 64B may be spaced apart from a neighboring column of the heat transfer pins 64B by a distance D6, which may be in a range from about 1 mm to about mm. It is appreciated that seven columns and seven rows of the heat transfer pins 64B are shown in FIG. 11B as an example, the array of heat transfer pins 64B may have any number of columns and rows of the heat transfer pins 64B, and the heat transfer pins 64B may be arranged in other patterns, such as staggered rows or the like.

In FIG. 11C, an array of heat transfer pins 68 and a cavity wall 69 are formed on the bottom lid 70, which is attached to a carrier 72 by a release film 71, such as a LTHC material. The bottom lid 70 and the carrier 20 may both have a shape corresponding to the shape of the carrier 20. As discussed above, the structure of FIG. 11C will be subsequently attached to the structure shown in FIGS. 11A and 11B such that the array of heat transfer pins 68 and the cavity wall 69 on the bottom lid 70 will be attached to corresponding ones of the array of heat transfer pins 64B and the cavity wall 65 shown in FIGS. 11A and 11B, thereby forming the cooling chamber 81 of the pin cooling system 118.

The bottom lid 70 may comprise silicon or a metal, such as copper. The formation of the heat transfer pins 68 and the cavity wall 69 may include forming a seed layer (not shown) over the bottom lid 70, forming a patterned mask (not shown) such as a photoresist or one or more layers of dielectric material over the seed layer, and plating a thermally conductive material on the exposed seed layer. The patterned mask and the portions of the seed layer covered by the patterned mask are removed. In embodiments in which the photoresist is used as the patterned mask, the patterned mask is removed by an acceptable ashing or stripping process, such as using an oxygen plasma or the like. In embodiments in which the one or more layers of dielectric material are used as the patterned mask, the patterned mask is removed by an acceptable stripping process, such as wet or dry etching. The remaining thermally conductive material and the underlying seed layer may be collectively referred to as the heat transfer pins 68 and the cavity wall 69 as shown in FIG. 11C. The seed layer and the plated thermally conductive material may be formed of the same material or different materials. The seed layer may be a single metal layer or a composite layer comprising a plurality of sub-layers formed of different metallic materials. In some embodiments, the seed layer may comprise a titanium layer and a copper layer over the titanium layer. The thermally conductive material may be a material of high thermal conductivity, such as such as copper or other metals. The seed layer may be formed using PVD or the like. The plating process may be performed using ECP, electro-less plating, or the like. The heat transfer pins 68 and the cavity wall 69 may have substantially the same height H2 within process variations, which may be in a range from about 0.1 mm to about 1 mm. The locations, sizes, and shapes of the array of the heat transfer pins 68 and the cavity wall 69 are substantially the same to those of the array of the heat transfer pins 64B and the cavity wall 65, respectively, within process variations.

Figure 12:
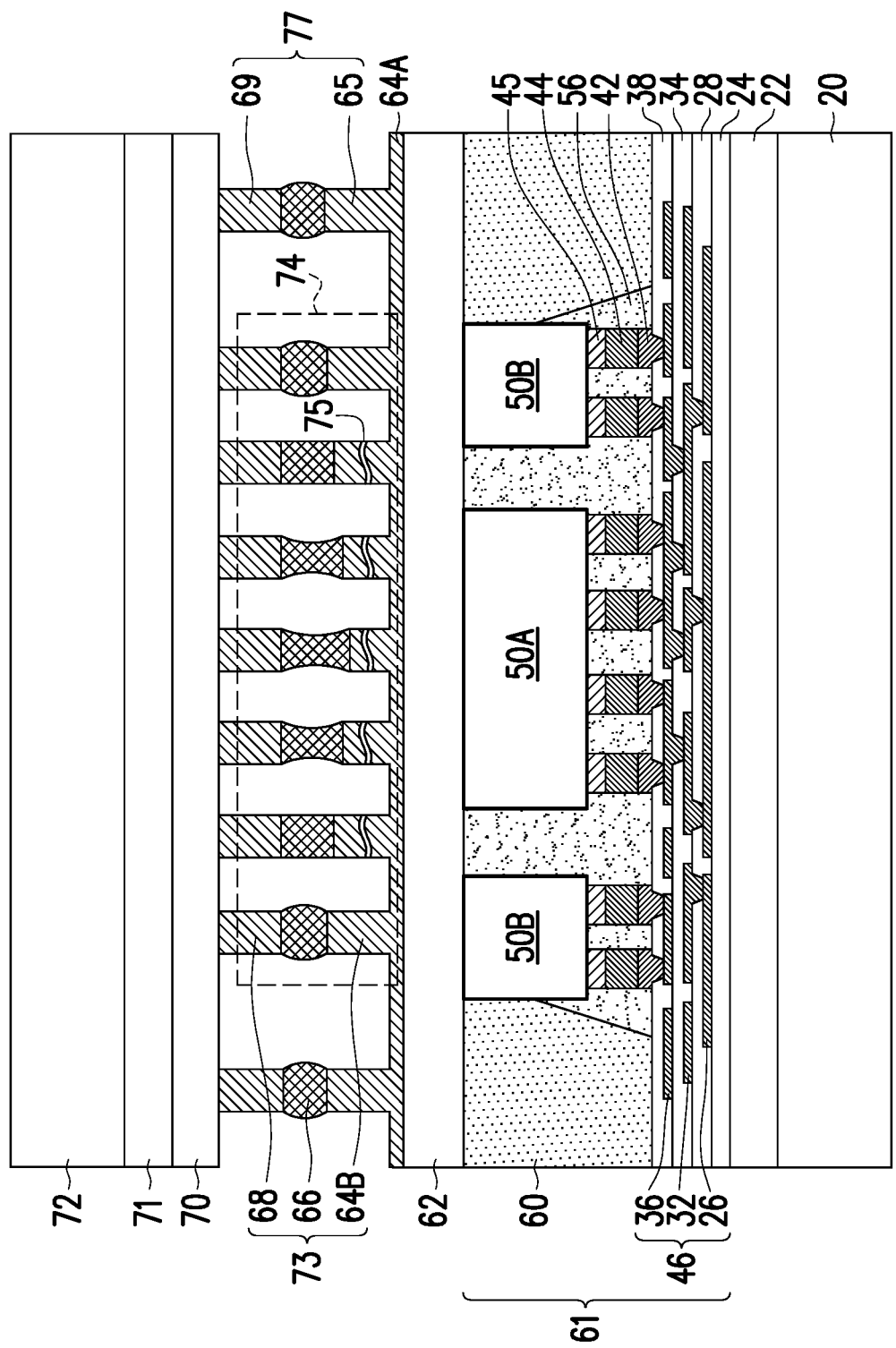

In FIG. 12, the heat transfer pins 68 and cavity walls 69 of the upper part illustrated in FIG. 11C is bonded to the heat transfer pins 64B and cavity walls 65 of the lower part illustrated in FIG. 11A using thermal connectors 66. The respective process is illustrated as process 222 in the process flow 200 as shown in FIG. 20. In some embodiments, the thermal connectors 66 may be solder balls, which may be placed on the heat transfer pins 64B and the cavity wall 65, the heat transfer pins 68 and the cavity wall 69, or both. The heat transfer pins 68 and the cavity wall 65 may be placed on the corresponding heat transfer pins 64B and the cavity wall 69, and a reflow process may be performed.

Due to warpage that may occur in the carrier 20, top surfaces of the heat transfer pins 64B and the cavity wall 65 may not be coplanar, though the heat transfer pins 64B and the cavity wall 65 may have substantially the same height H1. Divider 75 indicates a portion of each heat transfer pin 64B is omitted for illustrative purposes. For example, FIG. 12 shows an upper surface of the heat transfer layer 64A as being flat for illustrative purposes, and as discussed above, the upper surface of the heat transfer layer 64A may be curved due to warpage. The heights of the heat transfer pins 64B and the cavity wall 65 above the upper surface of the heat transfer layer 64A may be substantially the same within process variations. Thus, as illustrated in FIG. 12, the upper surfaces of the heat transfer pins 64B and the cavity wall 65 may not be coplanar due to warpage. The divider 75 indicates that portions of the heat transfer pins 64B and/or the cavity wall 65 may not be illustrated due to the warpage. As a result of the warpage, the sizes of gaps between the heat transfer pins 64B and the corresponding heat transfer pins 68 as well as gaps between the cavity wall 65 and the cavity wall 69 may vary, and using thermal connectors 66, such as solder, to bond the heat transfer pins 64B to the corresponding heat transfer pins 68 and the cavity wall 65 to the cavity wall 69 accounts for the different sizes of the gaps while forming connection between each heat transfer pin 64B and the corresponding heat transfer pin 68 as well as the seal between cavity wall 65 and cavity wall 69. As illustrated in FIG. 12, thermal connectors 66 of different shapes and sizes between each heat transfer pin 64B and the corresponding heat transfer pin 68 are formed. For example, large gaps may result in some of the thermal connectors 66 having middle sections thinner than top and bottom sections as well as concave sidewalls. Small gaps may result in some of the thermal connectors 66 having middle sections wider than top and bottom sections as well as convex sidewalls. Some of the thermal connectors 66 may have substantial straight sidewalls. The utilization of the thermal connectors 66 not only provides a heat transfer pathway from each heat transfer pin 64B to the corresponding heat transfer pin 68, thereby improving cooling capacity of the pin cooling system 118 (shown in FIG. 19A), but may also form a seal between the cavity wall 65 and the cavity wall 69, thereby preventing or reducing coolant leakage in the pin cooling system 118, as discussed in greater detail below.

The heat transfer pin 64B, each corresponding heat transfer pin 68, and each corresponding thermal connector 66, may be collectively referred to as a heat transfer pin structure 73, and the cavity wall 65, the cavity wall 69, and the corresponding thermal connectors 66 may be collectively referred to as a cavity wall structure 77.

Figure 13A:
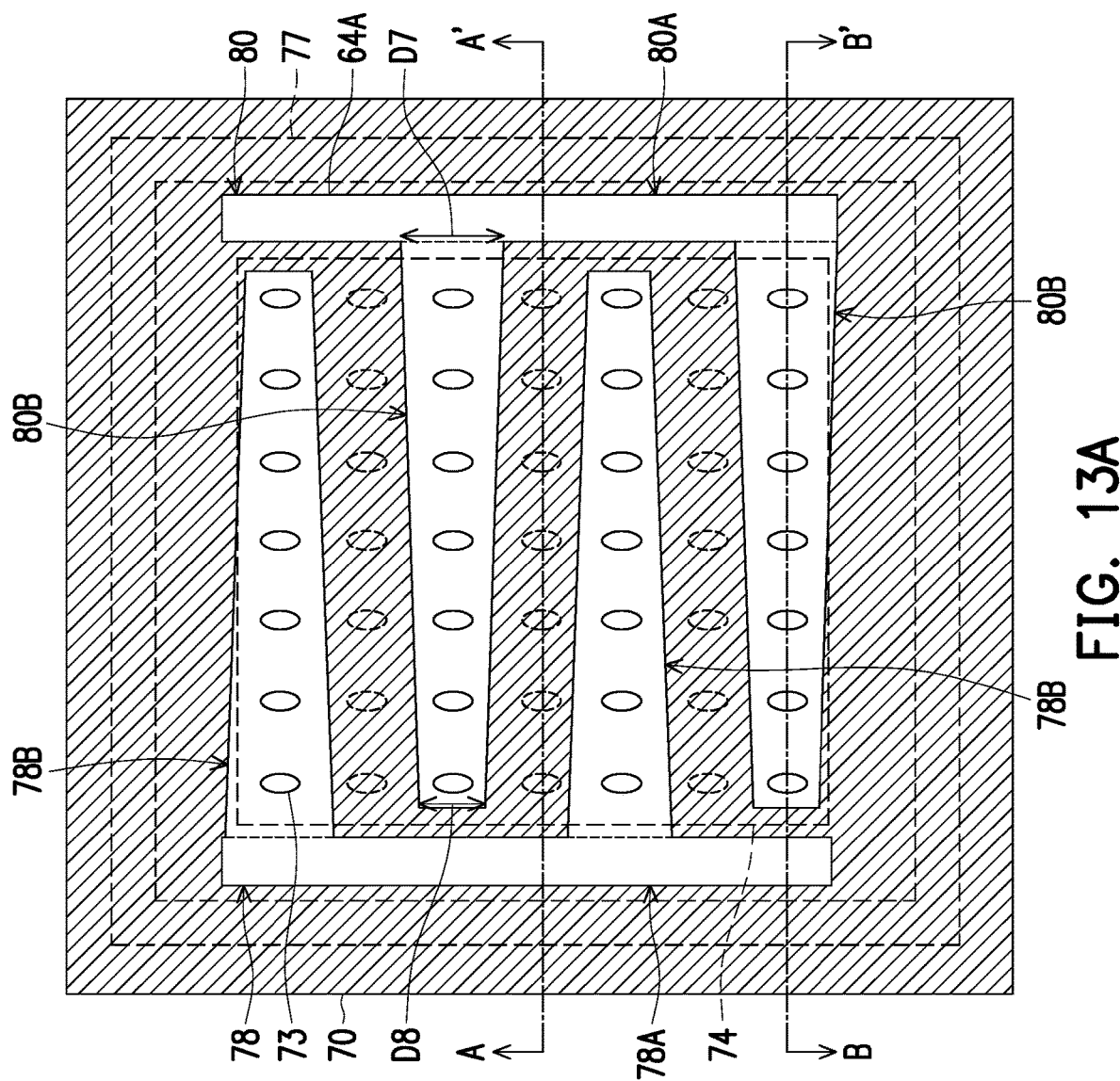
Figure 13B:
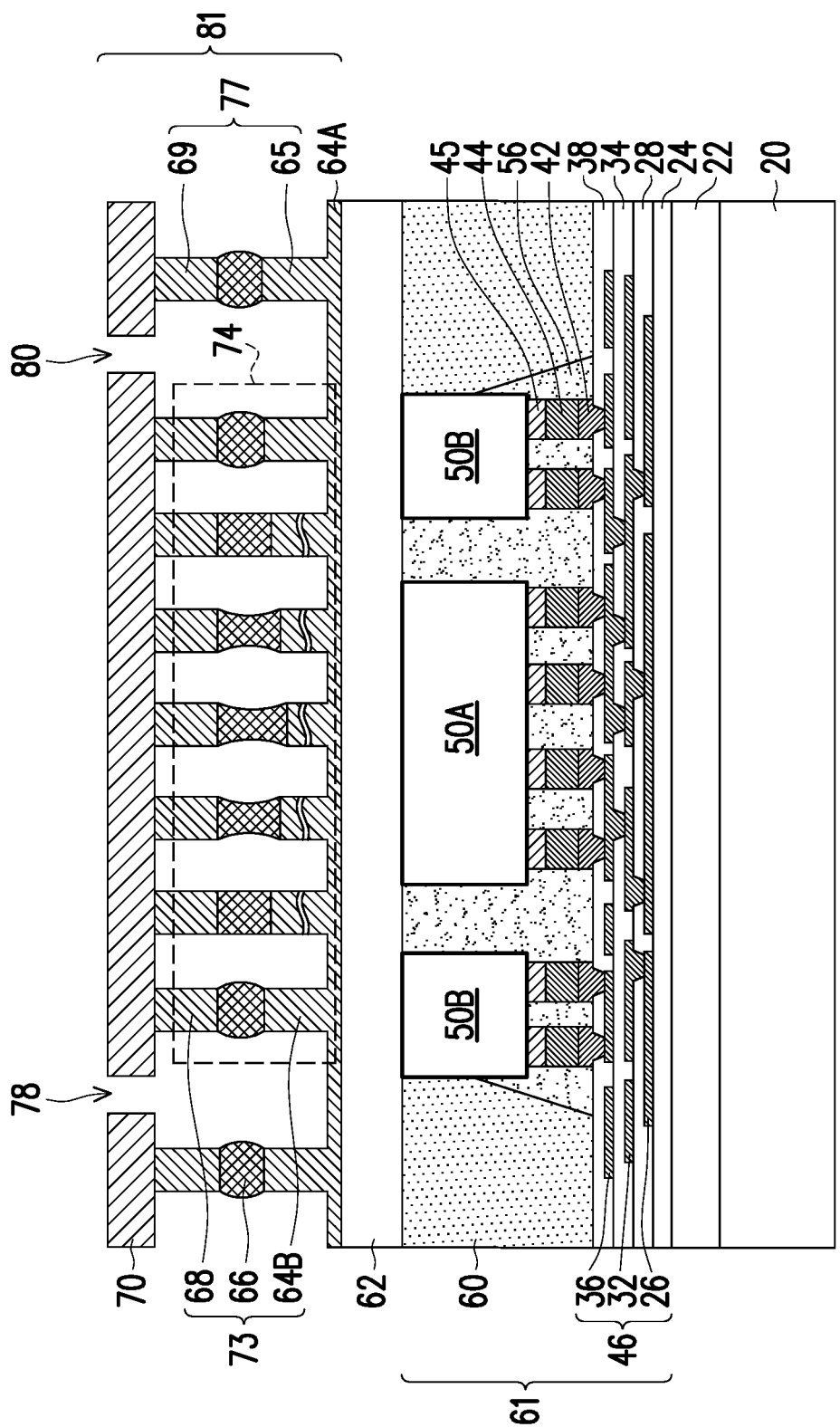
Figure 13C:
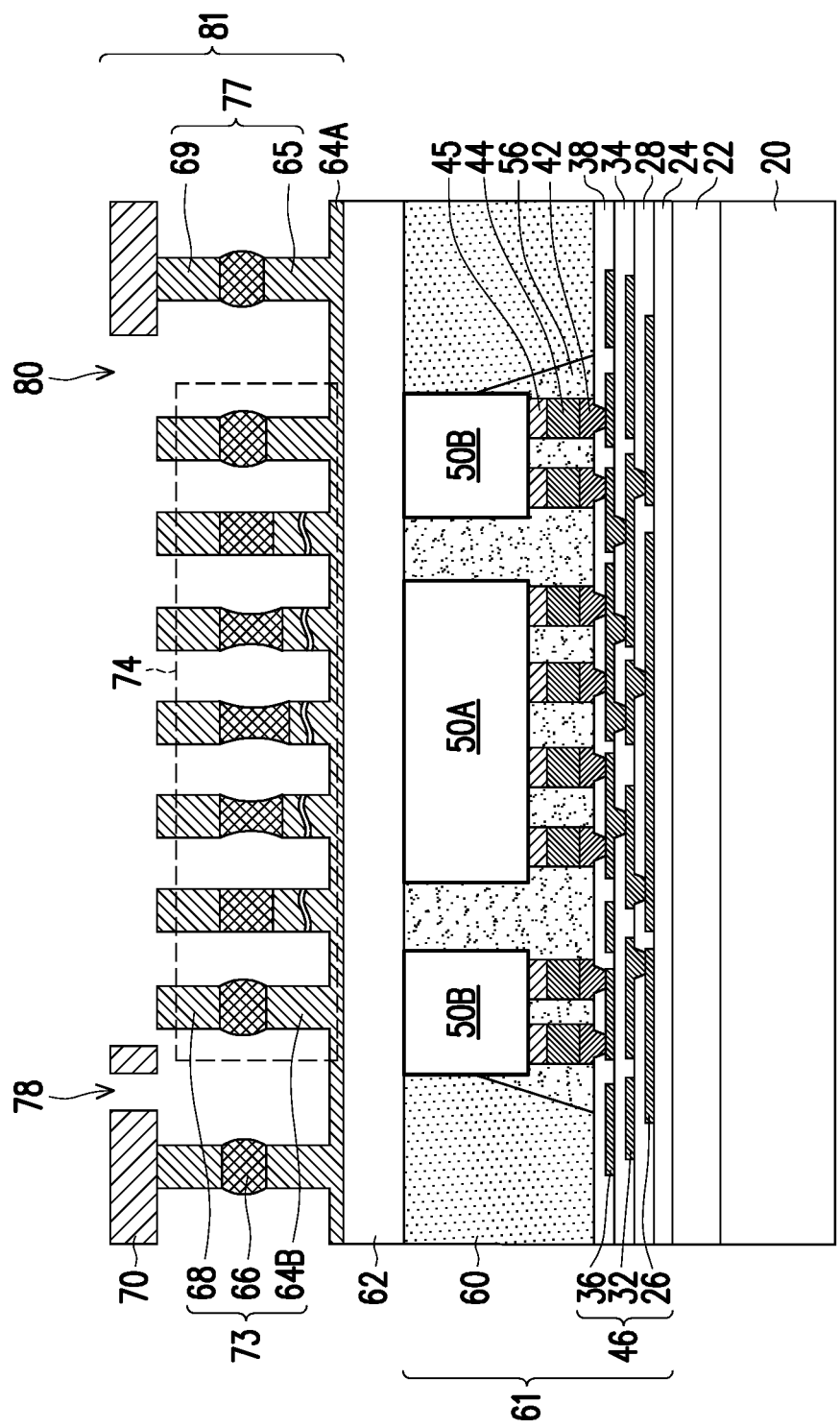

FIGS. 13A-13C illustrate the removal of the carrier 72 and formation of openings 78 and 80 in the bottom lid 70 in accordance with some in accordance with some embodiments. The respective process is illustrated as process 224 in the process flow 200 as shown in FIG. 20. The cross-sectional view shown in FIG. 13B may be obtained from the reference cross-section A-A' in the top view shown in FIG. 13A, and the cross-sectional view shown in FIG. 13C may be obtained from the reference cross-section B-B' in the top view shown in FIG. 13A, wherein like reference numerals refer to like features. In embodiments in which the release film 71 comprises an LTHC material, the removing of the carrier 72 may include projecting a light beam, such as a laser beam, on the release film 71 through the carrier 72, which may be transparent. As a result of the light exposure the release film 71 is decomposed, and the carrier 72 may be lifted off from the release film 71.

FIG. 13A is a top view and illustrates an embodiment in which the bottom lid is patterned to form the opening 78 and the opening 80 that may act as inlet, outlet, and channels for directing the flow of coolant in the pin cooling system 118. The opening 78 and the opening 80 may form an interdigitating pattern. The opening 78 may comprise a base segment 78A and digital segments 78B, and the opening 80 may comprise a base segment 80A and digital segments 80B. It is appreciated that two digital segments 78B and two digital segments 80B are shown in FIG. 13A for illustrative purposes and the base segment 78A and the base segment 80A may have any number of digital segments 78B and digital segments 80B, respectively. The base segments 78A are 80A may be formed outside and along the edges of the heat transfer pin region 74. The base segments 78A and 80A may expose the underlying heat transfer layer 64A, which may be free of the heat transfer pin structures 73. The dashed lines that separate the base segments 78A and 80A from the digital segments 78B and 80B in FIG. 13B are for illustrative purposes. The digital segments 78B and 80B may be disposed in an alternating pattern, wherein two neighboring digital segments 78B may be separated by one digital segment and two neighboring digital segments 80B may be separated by one digital segment 78B.

Still referring to FIG. 13A, in some embodiments, the digital segments 78B and 80B may have a shape that tapers as the digital segments 78B and 80B extend away from the base segments 78A are 80A, respectively. For example, the digital segment 80B may have a width D7 where the digital segment 80B is connected to the base segment and taper to a width D8 at an end of the digital segment 80B away from the base segment 80A. The width D7 may be in a range from about 0.02 mm to about 5 mm, and the width D8 may be in a range from about 0.01 mm to about 2.5 mm. The digital segments 78B may have similar widths as the digital segments 80B. The digital segments 78B and may be disposed directly above the heat transfer pin region 74 and may expose top surfaces of the underlying heat transfer pin structures 73 and the heat transfer layer 64A within the heat transfer pin region 74. Top surfaces of the heat transfer pin structures 73 and a top surface of the cavity wall structure 77 that remain covered by the bottom lid 70 are shown in dashed lines for illustrative purposes. It is appreciated that two digital segments 78B and two digital segments 80B are shown in FIG. 13A as an example, the bottom lid 70 may have any number of digital segments 78B and digital segments 80B. Additionally, other shapes, sizes, locations, or the like of the opening 78 and the opening may be used.

The openings 78 and 80 may be formed in the bottom lid 70 by any acceptable photolithography process, which may comprise forming a patterned mask on the bottom lid 70, etching the portions of the bottom lid 70 exposed by the patterned mask, and removing the patterned mask. The patterned mask may comprise a photoresist or one or more layers of dielectric material. The etching process may be a dry etching, such as a reactive ion etching (RIE), neutral beam etching (NBE), the like, or a combination thereof. The etching process may be anisotropic. In embodiments in which the photoresist is used as the patterned mask, the patterned mask is removed by an acceptable ashing or stripping process, such as using an oxygen plasma or the like. In embodiments in which the one or more layers of dielectric material are used as the patterned mask, the patterned mask is removed by an acceptable stripping process, such as wet or dry etching.

FIGS. 13B and 13C cross-sectional views, wherein FIG. 13A illustrates that after the openings 78 and 80 are formed, some of the heat transfer pin structures 73 remain attached to the bottom lid 70, while FIG. 13B illustrates that after the openings 78 and are formed, some of the heat transfer pin structures 73 may be exposed.

Figure 14:
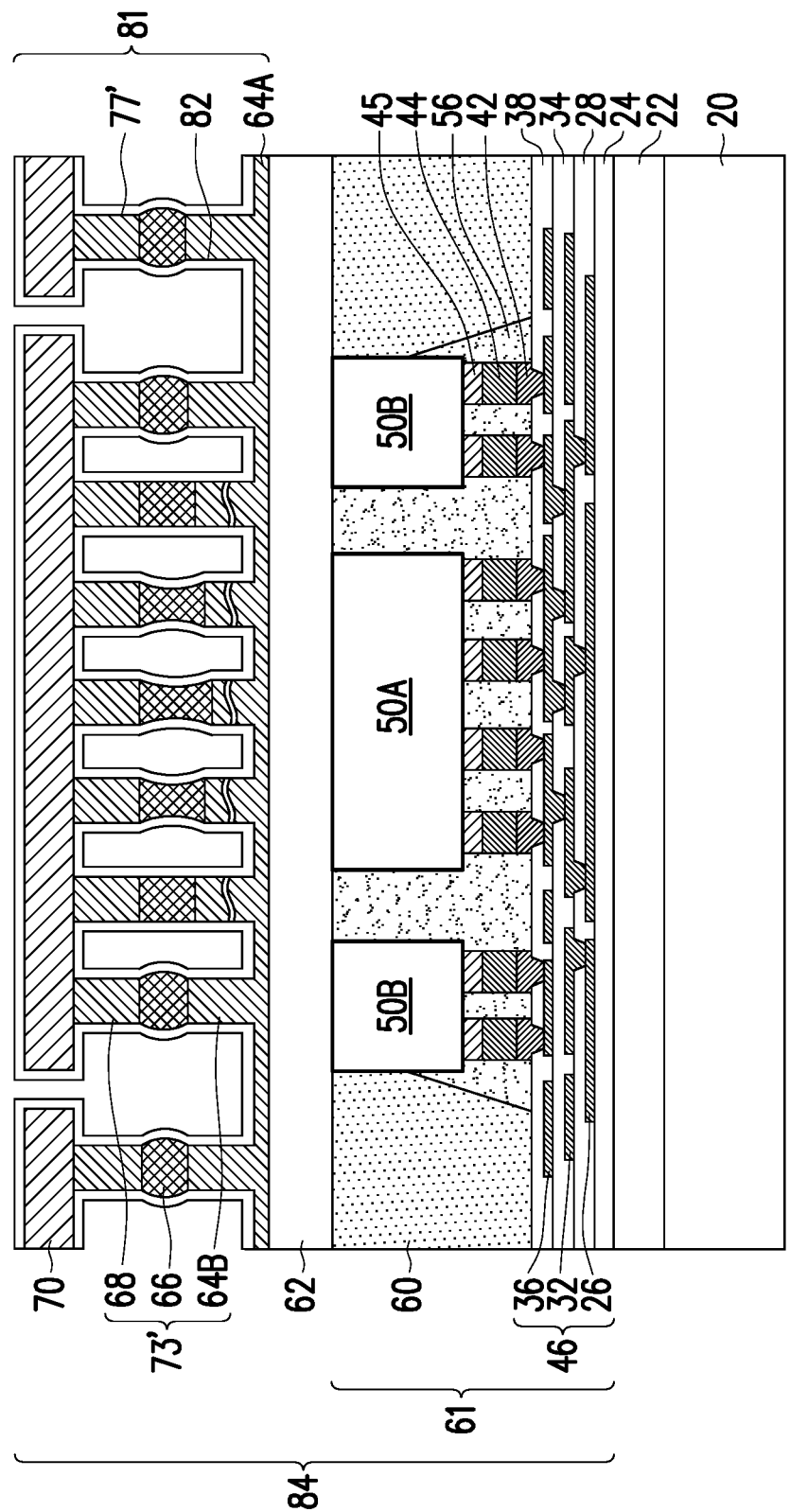

In FIG. 14, a protective layer 82 is formed on exposed surfaces of the heat transfer layer 64A, the heat transfer pin structures 73, the cavity wall structure 77, and the bottom lid 70. The respective process is illustrated as process 226 in the process flow 200 as shown in FIG. 20. As discussed in greater detail below, the coolant may flow into the cooling chamber 81 and through the heat transfer pin structures 73 during the operation of the pin cooling system 118. In some embodiments, the coolant may corrode or oxidize or otherwise degrade the material of the heat transfer layer 64A, the heat transfer pin structures 73, the cavity wall structure 77, and/or the bottom lid 70. For example, in embodiments in which the heat transfer layer 64A, the heat transfer pin structures 73, the cavity wall structure 77, and the bottom lid 70 are formed of copper, the protective layer 82 may reduce corrosion and oxidation on the surfaces of the heat transfer layer 64A, the heat transfer pin structures 73, the cavity wall structure 77, and the bottom lid 70 that may be in contact with the coolant. Accordingly, the protective layer 82 may comprise a material resistive to the coolant, such as aluminum oxide, silicon nitride, or the like, which may be formed by a deposition method, such as atomic layer deposition (ALD), chemical vapor deposition (CVD), or the like. The protective layer 82 may have a thickness from about 1 nm to about 50 nm. The wafer structure 61 and the structure formed over the wafer structure 61 may be collectively referred to as wafer structure 84. The heat transfer pin structure 73 and protective layer 82 on each heat transfer pin structure 73 may be collectively referred to as a heat transfer pin structure 73'. The cavity wall structure 77 and protective layer 82 on the cavity wall structure 77 may be collectively referred to as a cavity wall structure 77'.

Figure 15:
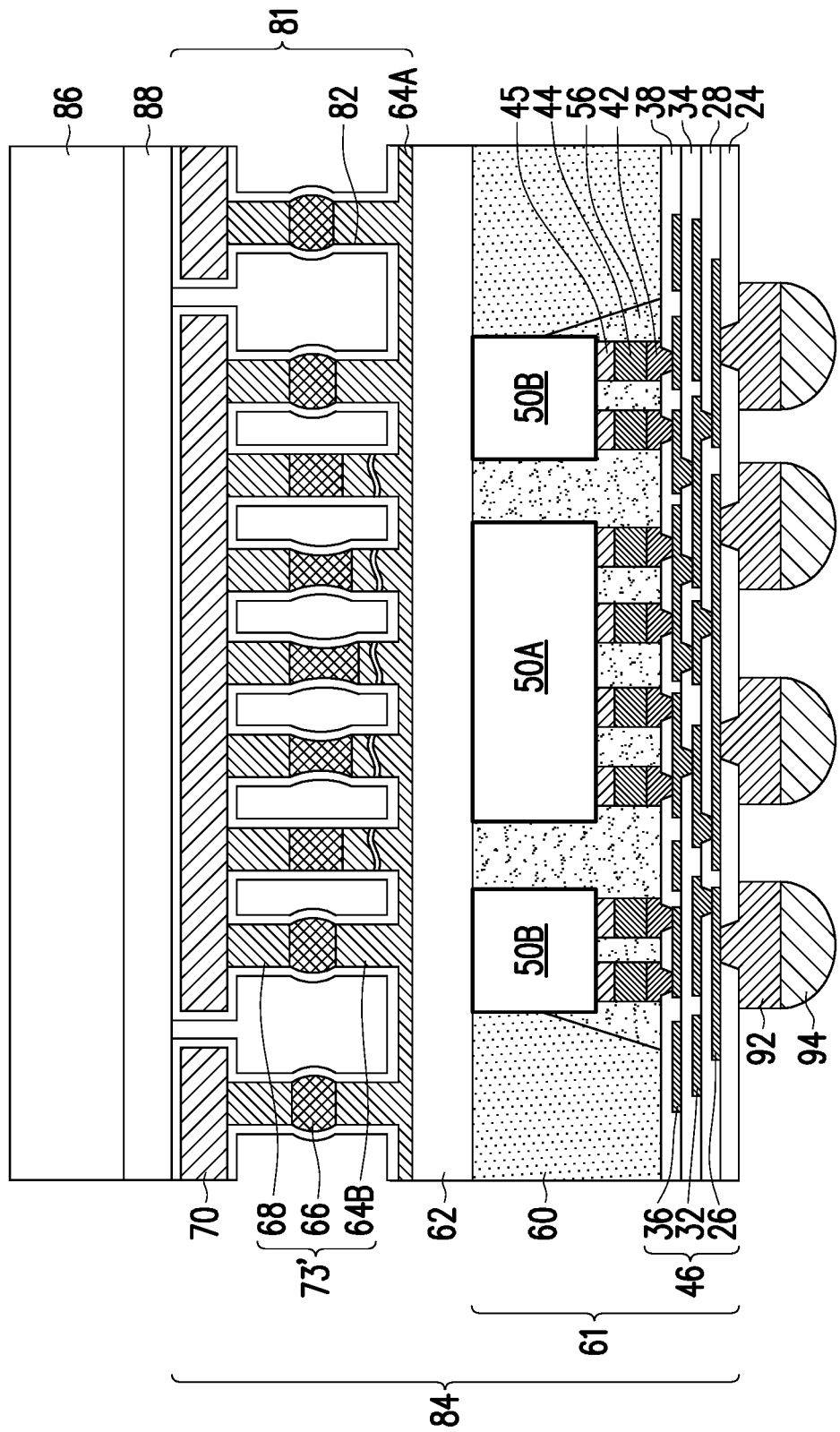

FIG. 15 illustrates a carrier swap and the formation of bottom-side electrical connectors on the bottom side of the interposer 46. The respective process is illustrated as process 228 in the process flow 200 as shown in FIG. 20. A carrier 86 is attached to a top surface of the bottom lid 70 using a release film 88, such as an LTHC material. The carrier 20, shown in FIG. 14, is detached from the wafer structure 84. In embodiments in which the release film 22 comprises an LTHC material, the detaching process may include projecting a light beam, such as a laser beam, on the release film 22 through the carrier 20, which may be transparent. As a result of the light exposure the release film 22 is decomposed, and the carrier 20 may be lifted off from the release film 22.

As a result of the detaching process, the insulating layer 24 is exposed. UBMs 92 and electrical connectors 94 are formed on interposer 46 to provide an electrical connection to the package components 50. The respective process is illustrated as process 230 in the process flow 200 as shown in FIG. 20. The formation of the UBMs 92 may include patterning the insulating layer 24 to form openings exposing conductive pads formed in the RDLs 26. The UBMs 92 extend into the openings in the insulating layer 24 and are formed on the exposed conductive pads. The UBMs 42 may be formed using the same or similar materials and processes as discussed above with reference to the RDLs 26. The electrical connectors 94 are formed on the UBMs 92. In some embodiments, the formation of the electrical connectors 94 may include placing solder balls on the exposed portions of the UBMs 92, and reflowing the solder balls. In some embodiments, the electrical connectors 94 may be non-solder metal pillars, or metal pillars and solder caps over the non-solder metal pillars.

Figure 16:
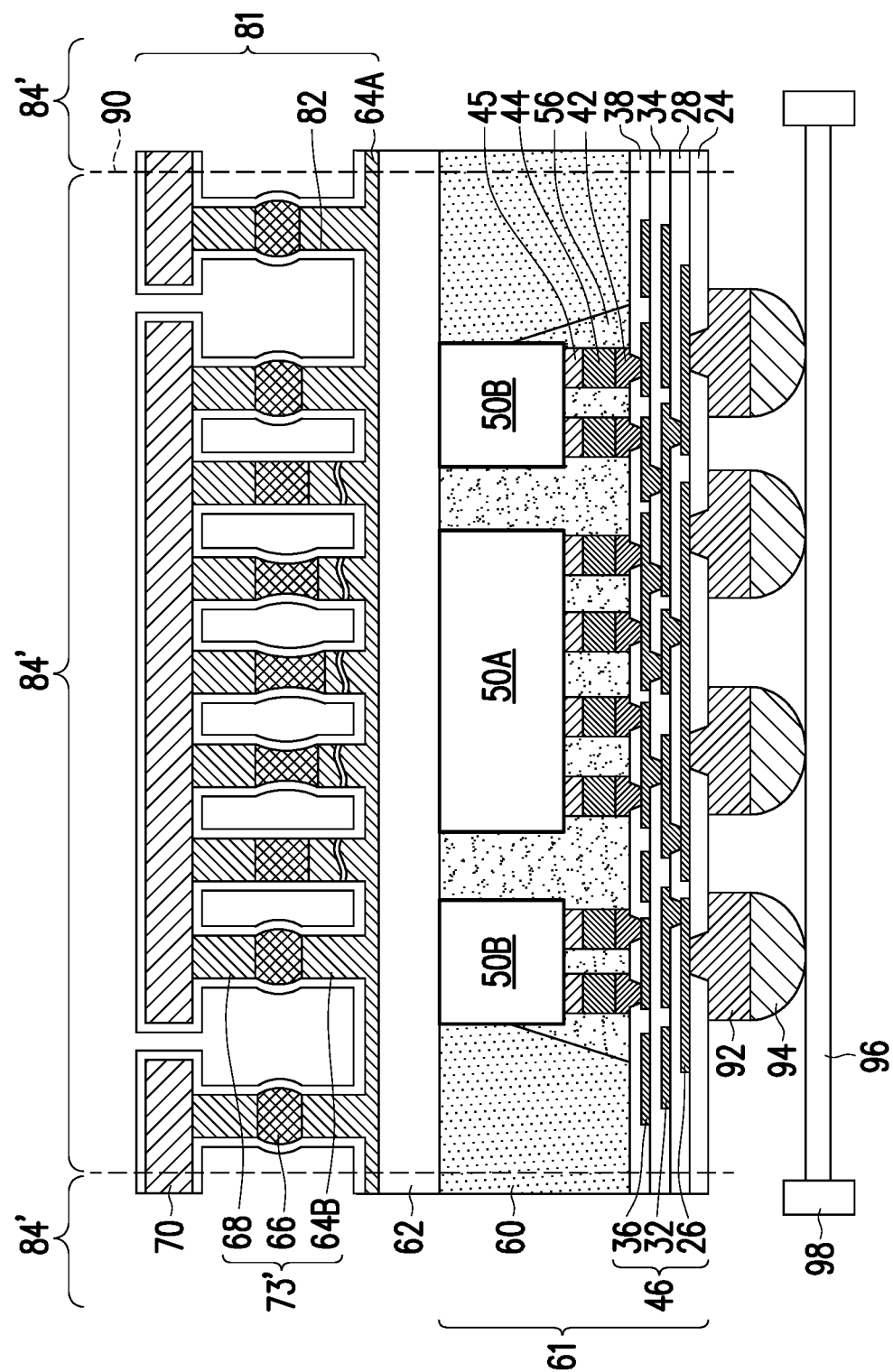

In FIG. 16, the wafer structure 84 is demounted from the carrier 86, shown in FIG. 14, for example, by projecting a laser beam on release film 88, so that the release film 88 decomposes. The respective process is illustrated as process 232 in the process flow 200 as shown in FIG. 20. The wafer structure 84 is placed on a tape 96 supported by a frame 98. The wafer structure 84 is singulated along scribe lines 90, so that the wafer structure 84 is separated into discrete package structures 84', which may have a rectangular shape in the top view and may have a length and a width in a range from about 2 mm to about 30 mm in a top view. The respective process is illustrated as process 234 in the process flow 200 as shown in FIG. 20. It is appreciated that FIG. 16 illustrates three package components in package structures 84' as an example, any number of the package components 50 may be in package structures 84'.

In FIG. 17, the package structure 84' is bonded to a substrate 100 via the electrical connectors 94. The respective process is illustrated as process 236 in the process flow 200 as shown in FIG. 20. The substrate 100 may be an interposer, a core substrate, a coreless substrate, a printed circuit board (PCB), a package, or the like. FIG. 17, shows an embodiment where the substrate 100 is a PCB, comprising contact pads 102 that are electrically connected to the interposer 46. An underfill 103 is dispensed into the gap between package structure 84' and the substrate 100. The underfill 103 may comprise the same or similar materials and be dispensed by the same or similar process as those of the underfill 56.

In FIG. 18, a stiffener ring 104 may be attached on the substrate 100, in accordance with some embodiments. The respective process is illustrated as process 238 in the process flow 200 as shown in FIG. 20. The stiffener ring 104 provides additional support to the substrate 100 during subsequent manufacturing processes and usage. The stiffener ring 104 may be laterally spaced apart from the package structure 84' and may encircle the package structure 84', thereby forming a cavity between the package structure 84' and the stiffener ring 104. In some embodiments, the stiffener ring 104 may comprise a material with large hardness such as a ceramic, a metal, or the like. The stiffener ring 104 may be attached utilizing an adhesive 106, such as an epoxy, glue, solder paste, thermal adhesive, or the like.

Figure 19B:
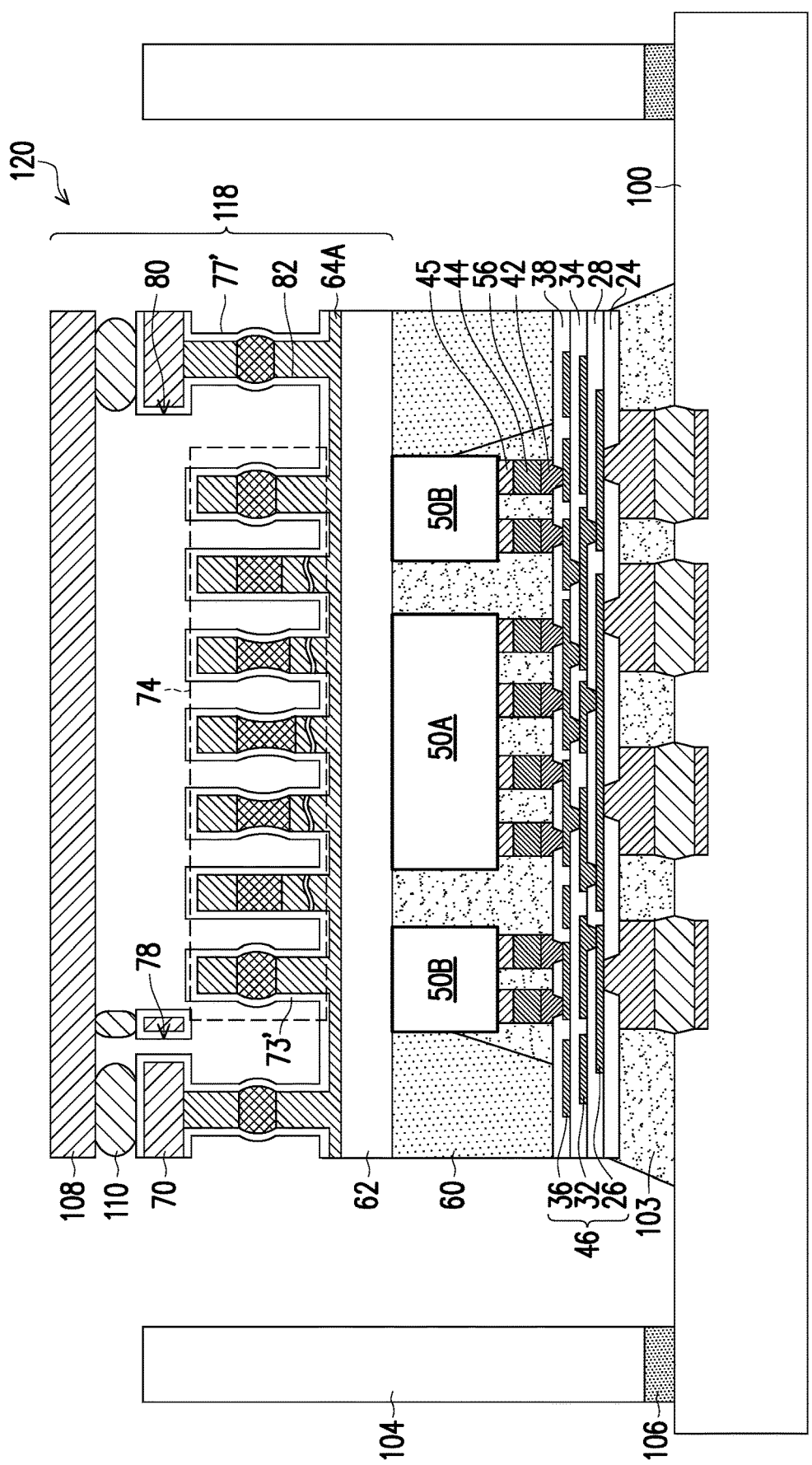
Figure 19C:
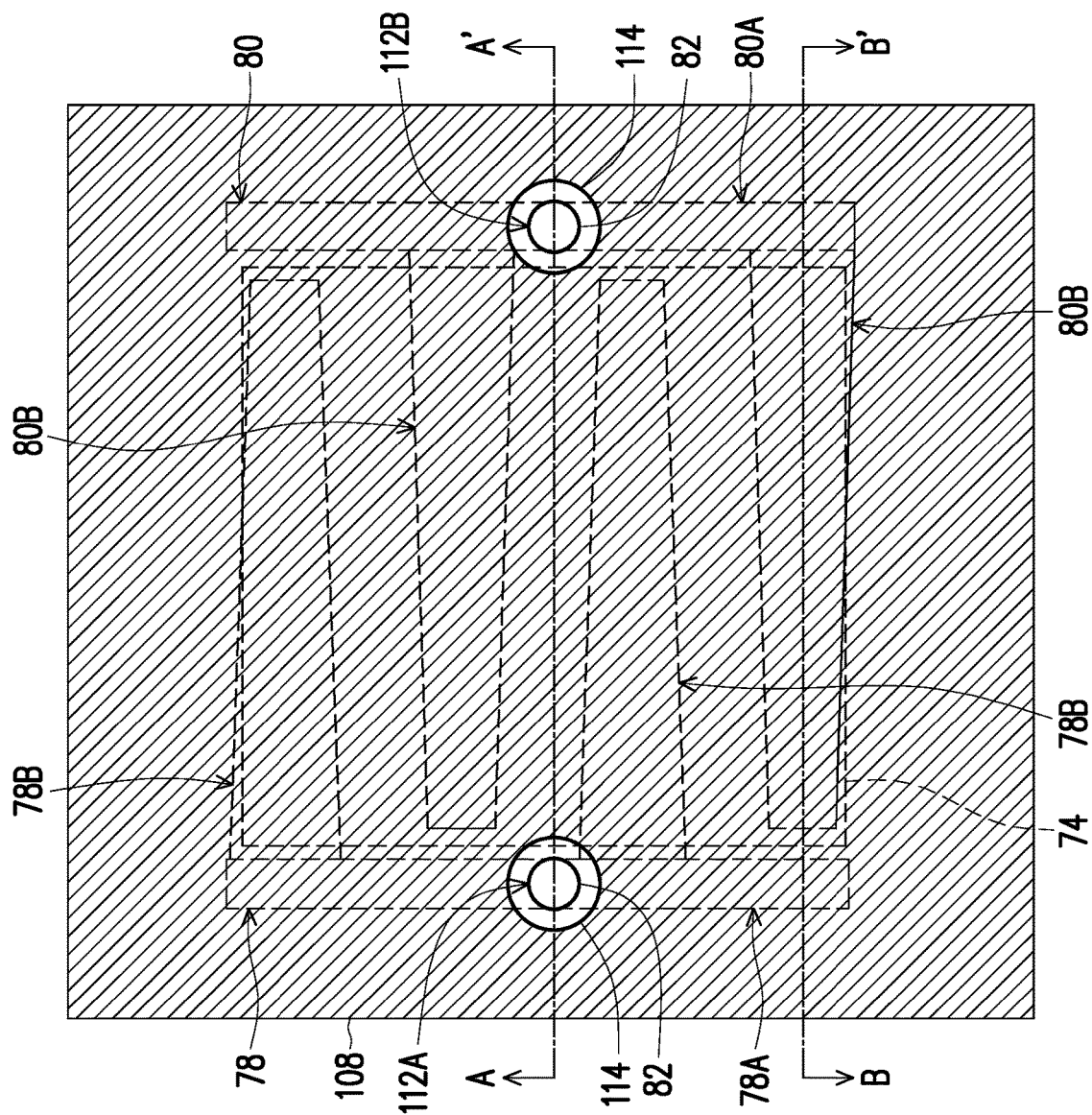

FIGS. 19A-19C illustrate the bonding of a top lid 108 to the bottom lid 70, in accordance with some embodiments. The respective process is illustrated as process 240 in the process flow 200 as shown in FIG. 20. The cross-sectional view shown in FIG. 19A may be obtained from the reference cross-section A-A' in the top view shown in FIG. 19C, and the cross-sectional view shown in FIG. 19B may be obtained from the reference cross-section B-B' in the top view shown in FIG. 19C, wherein like reference numerals refer to like features. As discussed in greater detail below, the top lid 108 not only has openings 112A and 112B that allow coolant to enter and leave the pin cooling system 118 but also contains in coolant inside the cooling chamber 81 underneath.

As illustrated in FIGS. 19A and 19B, the top lid 108 is bonded to the bottom lid 70, thereby forming semiconductor package 120. The top lid 108 may comprise aluminum or the like. A sealant 110, such as an epoxy or the like, may be used to bond the top lid 108 to the bottom lid 70. It is appreciated that the sealant 110 is shown as an example, and the top lid 108 may be bonded to the bottom lid 70 by other methods, such as fusion bonding or the like. The top lid 108 has openings 112A and 112B that may be disposed directly above the base segment 78A and the base segment 80A of the openings 78 and 80 in the bottom lid 70, respectively. The coolant hose adaptors 114 may be disposed over the openings 112A and 112B, and coolant hoses 116 may be connected to the coolant hose adaptors 114. The structure formed over the wafer structure 61 may be referred to as the pin cooling system 118. It is appreciated that FIGS. 17 through 19A show that the top lid 108 is bonded to the bottom lid 70 after the package structure 84' is bonded to the substrate 100 as an example, and the top lid 108 may be bonded to the bottom lid 70 before the package structure 84' is bonded to the substrate 100.

Still referring to FIG. 19A, pathway 119 shows a general flow direction in which the coolant may flow through the pin cooling system 118, using the base segment 80A (shown in FIG. 19C) of the opening 80 and the opening 112B as an inlet and the base segment 78A (shown in FIG. 19C) of the opening 78 and the opening 112A as an outlet. In some embodiments, the base segment 80A of the opening 80 and the opening 112B are used as the outlet and the base segment 78A of the opening 78 and the opening 112A are used as the inlet. During the operation of the semiconductor package 120, the heat generated by the package components 50 may be transferred to the pin cooling system 118 through the thermally conductive layer 62 and dissipated using the heat transfer pin structures 73' and the coolant flowing through the pin cooling system 118. As discussed above, using the thermal connectors 66 to create a connection between each heat transfer pin 64B and each corresponding heat transfer pin 68 (shown in FIG. 12) leads to the formation of each heat transfer pin structure 73', which provides a heat transfer pathway from the package components 50 to the coolant, thereby improving the cooling capacity of the pin cooling system 118, and thus efficiency and better long-term reliability of the semiconductor package 120. FIG. 19B shows another cross-sectional view in which the opening 80 may be disposed directly above the heat transfer pin region 74 and expose the underlying heat transfer pin structures 73' and the heat transfer layer 64A, which are coated with the protective layer 82.

In FIG. 19C, a top view of the pin cooling system 118 is shown. The coolant hose adaptors 114 may have a circular shape in the top view with openings in the center that correspond to the openings 112A and 112B in the top lid 108. Portions of the protective layer 82 that formed on the heat transfer layer 64A are exposed by the openings 112A and 112B in the top lid 108 and the underlying the base segment 78A and the base segment 80A of the openings 78 and 80 in the bottom lid 70 (shown in FIG. 19A). In some embodiments, during the operation of the pin cooling system 118, the coolant flows into the pin cooling system 118 through the opening 112B, and fills in the base segment which may act as an inlet. The coolant flows horizontally into the digital segments of the opening 80, which may act as channels. The tapering of the digital segments may aid in directing the flow of coolant horizontally and downward through the underlying heat transfer pin structures 73' in the cooling chamber 81 (shown in FIG. 19A). The coolant may flow laterally towards the neighboring heat transfer pin structures 73' underneath and the opening 78. Once the coolant is underneath the opening 78 (e.g., the base segment 78A and the digital segments 78B) the coolant may flow out of the pin cooling system 118 through the opening 112A. Throughout the above mentioned process, the top lid 108 and the cavity wall structure 77' keep the coolant contained inside the pin cooling system 118. During the operation of the pin cooling system 118, the coolant flow may be constant, which may lead to each heat transfer pin structures 73' in the heat transfer pin region 74 being constantly immersed in the coolant as the coolant constantly flows through the pin cooling system 118, thereby providing cooling for the semiconductor package 120.

The embodiments of the present disclosure have some advantageous features. By utilizing the thermal connectors 66 when forming the pin cooling system 118 over the package components 50, the heat generated by the package components 50 can be dissipated despite the presence of warpage on the surface where the pin cooling system 118 is formed, which leads to higher efficiency and better long-term reliability of the semiconductor package 120.

In an embodiment, a semiconductor package includes an interposer including one or more insulating layers and one or more redistribution lines in the one or more insulating layers; one or more package components bonded to the interposer, each of the one or more package components including a semiconductor die; an encapsulant on the interposer, wherein the encapsulant encircles the one or more package components in a top view; and a cooling system over the one or more package components, the cooling system including one or more metal layers on top surfaces of the one or more package components; first metal pins on the one or more metal layers; second metal pins, wherein each of the second metal pins is bonded to a corresponding one of the first metal pins by solder; and a first lid over the second metal pins, wherein the first lid includes a first opening and a second opening. In an embodiment, the semiconductor package further includes a protective layer along sidewalls of the first metal pins and the second metal pins. In an embodiment, a first solder region that bonds first one of the first metal pins and first one of the second metal pins has a middle portion narrower than a top portion and a bottom portion. In an embodiment, a second solder region that bonds second one of the first metal pins and second one of the second metal pins has a middle portion wider than a top portion and a bottom portion. In an embodiment, the semiconductor package further includes a second lid bonded to the first lid, wherein the second lid includes a third opening and a fourth opening, and wherein the third opening and the fourth opening are disposed directly over the first opening and the second opening, respectively. In an embodiment, the first opening includes a base segment and a first digital segment in the top view, wherein the first digital segment is connected to the base segment, wherein the base segment is disposed directly over a first portion of the one or more metal layers, wherein the first portion of the one or more metal layers is free of the first metal pins, and wherein the first digital segment is disposed over one or more of the second metal pins. In an embodiment, the first opening includes a base segment and a first digital segment in the top view, wherein the first digital segment is connected to the base segment, and wherein a width of the first digital segment tapers as the first digital segment extends away from the base segment. In an embodiment, the first opening includes a first base segment and a first digital segment in the top view, wherein the first digital segment is connected to the first base segment, wherein the second opening includes a second base segment, a second digital segment, and a third digital segment, wherein the second digital segment and the third digital segment are connected to the second base segment, and wherein the first digital segment is disposed between the second digital segment and the third digital segment. In an embodiment, the semiconductor package further includes a substrate bonded to the interposer, wherein the substrate is electrically connected to the one or more package components, and wherein a stiffener ring is disposed on the substrate and encircles the interposer in the top view.

In an embodiment, a semiconductor package includes a first redistribution structure including one or more insulating layers and one or more conductive lines in the one or more insulating layers; a package component bonded to the first redistribution structure, the package component including a semiconductor die; an encapsulant on the first redistribution structure, wherein the encapsulant extends laterally from an edge of the first redistribution structure to the package component; and a heat dissipation structure on a top surface of the package component, the heat dissipation structure including a heat transfer layer in direct contact with the top surface of the package component; a first heat transfer column on the heat transfer layer, wherein the first heat transfer column includes a first portion and a second portion, wherein the second portion is bonded to the first portion by solder; a first lid on the first heat transfer column, wherein the first lid includes a first opening and a second opening; and a second lid on the first lid, wherein the second lid includes a third opening and a fourth opening, wherein the third opening overlaps the first opening in a top view, and wherein the fourth opening overlaps the second opening in the top view. In an embodiment, the first opening and the second opening form an interdigitating pattern in the top view. In an embodiment, the first heat transfer column is connected to the first lid, and wherein sidewalls of the first heat transfer column are covered by a protective material. In an embodiment, a second heat transfer column is disposed on the heat transfer layer adjacent the first heat transfer column, wherein the second heat transfer column includes a third portion and a fourth portion, the fourth portion being bonded to the third portion by solder, wherein the second heat transfer column is disposed directly underneath the first opening, and wherein a top surface and sidewalls of the second heat transfer column are covered by the protective material. In an embodiment, the solder of the first heat transfer column has a first thickness and the solder of the second heat transfer column has a second thickness, the first thickness being different than the second thickness.

In an embodiment, a method of manufacturing a semiconductor package, the method includes bonding a package component to a first side of an interposer, wherein the interposer includes a one or more insulating layers and one or more redistribution lines in the one or more insulating layers; forming an encapsulant on the interposer, the encapsulant extending along sidewalls of the package component; forming one or more metal layers over the package component and the encapsulant; forming first pins on the one or more metal layers; forming second pins on a first lid; bonding the first pins to the second pins by solder; and etching a first opening and a second opening in the first lid. In an embodiment, the method further includes forming a protective layer on sidewalls of the first pins and the second pins. In an embodiment, top surfaces of the first pins are non-coplanar. In an embodiment, the first opening and the second opening form an interdigitating pattern in a top view. In an embodiment, the method further includes bonding a second lid to the first lid, wherein the second lid includes a third opening and a fourth opening, and wherein the third opening and the fourth opening overlap with the first opening and the second opening, respectively, in a top view. In an embodiment, the method further includes bonding a second side of the interposer to a substrate, wherein the substrate is electrically connected to the package component; and placing a stiffener ring on the substrate, wherein the stiffener ring encircles the interposer in a top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
    an interposer comprising one or more insulating layers and one or more redistribution lines in the one or more insulating layers;
    one or more package components bonded to the interposer, each of the one or more package components comprising a semiconductor die;
    an encapsulant on the interposer, wherein the encapsulant encircles the one or more package components in a top view; and
    a cooling system over the one or more package components, the cooling system comprising:
        one or more metal layers on top surfaces of the one or more package components;
        first metal pins on the one or more metal layers;
        second metal pins, wherein each of the second metal pins is bonded to a corresponding one of the first metal pins by solder, one of the first metal pins having a same width as a corresponding one of the second metal pins; and
        a first lid over the second metal pins, wherein the first lid comprises a first opening and a second opening.

2. The semiconductor package of claim 1, further comprising a protective layer along sidewalls of the first metal pins and the second metal pins.

3. The semiconductor package of claim 1, wherein a first solder region that bonds first one of the first metal pins and first one of the second metal pins has a middle portion narrower than a top portion and a bottom portion.

4. The semiconductor package of claim 3, wherein a second solder region that bonds second one of the first metal pins and second one of the second metal pins has a middle portion wider than a top portion and a bottom portion.

5. The semiconductor package of claim 1, further comprising a second lid bonded to the first lid, wherein the second lid comprises a third opening and a fourth opening, and wherein the third opening and the fourth opening are disposed directly over the first opening and the second opening, respectively.

6. The semiconductor package of claim 1, wherein the first opening comprises a base segment and a first digital segment in the top view, wherein the first digital segment is connected to the base segment, wherein the base segment is disposed directly over a first portion of the one or more metal layers, wherein the first portion of the one or more metal layers is free of the first metal pins, and wherein the first digital segment is disposed over one or more of the second metal pins.

7. The semiconductor package of claim 1, wherein the first opening comprises a base segment and a first digital segment in the top view, wherein the first digital segment is connected to the base segment, and wherein a width of the first digital segment tapers as the first digital segment extends away from the base segment.

8. The semiconductor package of claim 1, wherein the first opening comprises a first base segment and a first digital segment in the top view, wherein the first digital segment is connected to the first base segment, wherein the second opening comprises a second base segment, a second digital segment, and a third digital segment, wherein the second digital segment and the third digital segment are connected to the second base segment, and wherein the first digital segment is disposed between the second digital segment and the third digital segment.

9. The semiconductor package of claim 1, further comprising a substrate bonded to the interposer, wherein the substrate is electrically connected to the one or more package components, and wherein a stiffener ring is disposed on the substrate and encircles the interposer in the top view.

10. A semiconductor package comprising:
    a first redistribution structure comprising one or more insulating layers and one or more conductive lines in the one or more insulating layers;
    a package component bonded to the first redistribution structure, the package component comprising a semiconductor die;
    an encapsulant on the first redistribution structure, wherein the encapsulant extends laterally from an edge of the first redistribution structure to the package component; and
    a heat dissipation structure on a top surface of the package component, the heat dissipation structure comprising:
        a heat transfer layer in direct contact with the top surface of the package component;
        a first heat transfer column on the heat transfer layer, wherein the first heat transfer column comprises a first portion and a second portion, wherein the second portion is bonded to the first portion by solder;
        a first lid on the first heat transfer column, wherein the first lid comprises a first opening and a second opening; and
        a second lid over and bonded to the first lid, wherein the second lid comprises a third opening and a fourth opening, wherein the third opening overlaps the first opening in a top view, and wherein the fourth opening overlaps the second opening in the top view.

11. The semiconductor package of claim 10, wherein the first opening and the second opening form an interdigitating pattern in the top view.

12. The semiconductor package of claim 10, wherein the first heat transfer column is connected to the first lid, and wherein sidewalls of the first heat transfer column are covered by a protective material.

13. The semiconductor package of claim 12, wherein a second heat transfer column is disposed on the heat transfer layer adjacent the first heat transfer column, wherein the second heat transfer column comprises a third portion and a fourth portion, the fourth portion being bonded to the third portion by solder, wherein the second heat transfer column is disposed directly underneath the first opening, and wherein a top surface and sidewalls of the second heat transfer column are covered by the protective material.

14. The semiconductor package of claim 13, wherein the solder of the first heat transfer column has a first thickness and the solder of the second heat transfer column has a second thickness, the first thickness being different than the second thickness.

15. A semiconductor package comprising:
- an interposer comprising insulating layers and redistribution lines in the insulating layers;
- a package component bonded to the interposer, wherein the package component comprises a semiconductor die;
- an encapsulant on the interposer, wherein the encapsulant encircles the package component in a top-down view; and
- a cooling system on the package component and the encapsulant, the cooling system comprising:
  - a metal layer;
  - a first lower metal pin on the metal layer;
  - a first upper metal pin bonded to the first lower metal pin by a first connector; and
  - a first lid over the first upper metal pin, wherein the first lid comprises a first opening and a second opening, and wherein the first opening and the second opening define an interdigitating pattern in the top-down view.

16. The semiconductor package of claim 15, wherein the cooling system further comprises a dielectric layer on sidewalls of the first upper metal pin, the first connector, and the first lower metal pin.

17. The semiconductor package of claim 16, wherein the first upper metal pin is directly underneath the first opening, and wherein the dielectric layer is on a top surface of the first upper metal pin.

18. The semiconductor package of claim 17, wherein the cooling system further comprises:
- a second lower metal pin on the metal layer; and
- a second upper metal pin bonded to the second lower metal pin by a second connector, wherein the second upper metal pin is connected to the first lid, and wherein the dielectric layer is on sidewalls of the second upper metal pin, the second connector, and the second lower metal pin.

19. The semiconductor package of claim 15, wherein the first connector comprises concave sidewalls.

20. The semiconductor package of claim 19, wherein the cooling system further comprises:
- a second lower metal pin on the metal layer; and
- a second upper metal pin bonded to the second lower metal pin by a second connector, wherein the second connector comprises convex sidewalls.

* * * * *